(12) United States Patent
Kim et al.

(10) Patent No.: US 10,529,784 B2
(45) Date of Patent: Jan. 7, 2020

(54) TEMPERATURE SENSOR, METHOD FOR MANUFACTURING TEMPERATURE SENSOR, AND DISPLAY DEVICE TO WHICH TEMPERATURE SENSOR IS APPLIED

(71) Applicant: LG DISPLAY CO., LTD., Seoul (KR)

(72) Inventors: Tae Whan Kim, Seoul (KR); Young Pyo Jeon, Seoul (KR); Yong Hoon Choi, Seoul (KR); Yu Ra Kim, Yangju-Si (KR)

(73) Assignee: LG DISPLAY CO., LTD., Seoul (KR)

( * ) Notice: Subject to any disclaimer, the term of this patent is extended or adjusted under 35 U.S.C. 154(b) by 186 days.

(21) Appl. No.: 15/561,841

(22) PCT Filed: Mar. 28, 2016

(86) PCT No.: PCT/KR2016/003110
§ 371 (c)(1),
(2) Date: Sep. 26, 2017

(87) PCT Pub. No.: WO2016/159603
PCT Pub. Date: Oct. 6, 2016

(65) Prior Publication Data
US 2018/0122872 A1    May 3, 2018

(30) Foreign Application Priority Data

Mar. 27, 2015  (KR) .................. 10-2015-0043326

(51) Int. Cl.
*H01L 27/32* (2006.01)
*G01K 1/16* (2006.01)
(Continued)

(52) U.S. Cl.
CPC ............ *H01L 27/3225* (2013.01); *G01K 1/16* (2013.01); *G01K 11/20* (2013.01); *G09G 3/3233* (2013.01); *G09G 2320/041* (2013.01)

(58) Field of Classification Search
CPC .............. H01L 27/3225; H01L 27/326; H01L 51/5012; H01L 51/56; C09K 11/06;
(Continued)

(56) References Cited

U.S. PATENT DOCUMENTS 6,188,378 B1 * 2/2001 Yamamoto ........... G09G 3/3406
345/101
9,232,599 B2 * 1/2016 Lee .................... H05B 33/0854
(Continued)

FOREIGN PATENT DOCUMENTS

JP  2005-338777 A   12/2005
JP  2007-212302 A    8/2007
(Continued)

OTHER PUBLICATIONS

International Search Report (PCT/ISA/210) issued in PCT/KR2016/003110, dated Jul. 14, 2016.

*Primary Examiner* — Lisa M Caputo
*Assistant Examiner* — Philip L Cotey
(74) *Attorney, Agent, or Firm* — Birch, Stewart, Kolasch & Birch, LLP

(57) ABSTRACT

There are disclosed a temperature sensor and a method for manufacturing the same. The temperature sensor comprises; a sensor unit including an organic light emitting layer including a delayed fluorescent material; a temperature transfer unit located below the sensor unit to transfer an external temperature to the sensor unit; a first electrode located on the sensor unit; a second electrode located below the sensor unit to be spaced apart from the temperature transfer unit; and a light intensity measuring unit located below the second electrode and measuring the intensity of light emitted from the organic light emitting layer. The temperature sensor can measure a temperature by using a
(Continued)

change in the intensity of light using delayed fluorescence, thereby providing improved sensitivity.

19 Claims, 12 Drawing Sheets

(51) Int. Cl.
   *G01K 11/20* (2006.01)
   *G09G 3/3233* (2016.01)
(58) Field of Classification Search
   CPC .......... G01K 1/16; G01K 11/20; G01K 11/12; G01K 11/16; G01K 11/165; G09G 3/3233; G09G 2300/0861; G09G 2310/0251; G09G 2310/0262; G09G 2320/041; H05B 33/0896
   See application file for complete search history.

(56) References Cited

U.S. PATENT DOCUMENTS

| | | | | |
|---|---|---|---|---|
| 9,852,705 | B2* | 12/2017 | Kim | G09G 3/3614 |
| 9,935,286 | B2* | 4/2018 | Watabe | H01L 51/0072 |
| 10,074,806 | B2* | 9/2018 | Adamovich | H01L 51/0054 |
| 2004/0032679 | A1* | 2/2004 | Miteva | G01K 11/20 359/883 |
| 2005/0205880 | A1 | 9/2005 | Anzai et al. | |
| 2007/0052664 | A1* | 3/2007 | Hirakata | G02F 1/133604 345/102 |
| 2008/0088574 | A1* | 4/2008 | Tsujii | G09G 3/342 345/102 |
| 2010/0008394 | A1* | 1/2010 | Miteva | G01K 11/20 374/1 |
| 2015/0054426 | A1 | 2/2015 | Han et al. | |
| 2015/0155500 | A1* | 6/2015 | Yersin | H01L 51/0072 252/500 |
| 2015/0280148 | A1* | 10/2015 | Akashi | H01L 51/0091 546/10 |
| 2015/0289778 | A1* | 10/2015 | Ohl | H04N 5/35554 600/301 |
| 2016/0020409 | A1* | 1/2016 | Adachi | C07F 9/65815 544/35 |
| 2016/0093823 | A1* | 3/2016 | Seo | H01L 51/5016 257/40 |
| 2016/0276601 | A1* | 9/2016 | Choi | H01L 51/5008 |
| 2017/0092874 | A1* | 3/2017 | Tanabe | C07D 487/04 |

FOREIGN PATENT DOCUMENTS

| | | |
|---|---|---|
| JP | 2013-116975 A | 6/2013 |
| KR | 10-2010-0120272 A | 11/2010 |
| KR | 10-2015-0021819 A | 3/2015 |

* cited by examiner

TEMPERATURE SENSOR, METHOD FOR MANUFACTURING TEMPERATURE SENSOR, AND DISPLAY DEVICE TO WHICH TEMPERATURE SENSOR IS APPLIED

CROSS-REFERENCED TO RELATED APPLICATIONS

This application is the National Phase of PCT International Application No. PCT/KR2016/003110 filed on Mar. 28, 2016, which claims priority under 35 U.S.C. 119(a) to Korean Patent Application No. 10-2015-0043326 filed on Mar. 27, 2015 in Republic of Korea, all of these applications are hereby expressly incorporated by reference into the present application.

BACKGROUND OF THE INVENTION

Technical Field

The present disclosure relates to a temperature sensor, a method for manufacturing the temperature sensor, and a display device to which the temperature sensor is applied, and more particularly, to a temperature sensor, a method for manufacturing the temperature sensor, and a display device to which the temperature sensor is applied capable of measuring a temperature by using a change in intensity of light using delayed fluorescence.

Background Art

A temperature sensor uses changing electrical characteristics of materials or electronic devices according to a temperature.

When the temperature sensor is used, it is general to use a temperature sensor suitable for the use purpose by considering view points such as a detection temperature range, detection accuracy, temperature characteristics, mass productivity and reliability.

The temperature sensor is sorted into a contact type and a contactless type. As the type of temperature sensor, the contact type includes a resistance temperature sensor, a thermistor, a thermocouple, a bimetal, and the contactless type often uses a radiation thermometer and an advertisement thermometer. In the case of the contact type temperature sensor, the accuracy of measuring the temperature is high, but since a portion to measure the temperature needs to be directly contacted, a usable range is limited. Further, the contactless type temperature sensor may be variously applied and used, but has problems in accuracy and reliability.

Therefore, it is necessary to study a temperature sensor with a high sensitivity at a simple process and low cost by comparing conventional sensors.

SUMMARY OF THE INVENTION

An object of the present disclosure is to provide a temperature sensor, a method for manufacturing the temperature sensor, and a display device to which the temperature sensor is applied capable of measuring a temperature by using a change in intensity of light using delayed fluorescence.

The objects of the present disclosure are not limited to the aforementioned objects, and other objects, which are not mentioned above, will be apparent to a person having ordinary skill in the art from the following description.

An exemplary embodiment of the present disclosure provides a temperature sensor. The temperature sensor may include a sensor unit including an organic light emitting layer including a delayed fluorescent material; a temperature transfer unit located below the sensor unit to transfer an external temperature to the sensor unit; a first electrode located on the sensor unit; a second electrode located below the sensor unit to be spaced apart from the temperature transfer unit; and a light intensity measuring unit located below the second electrode to measure intensity of light emitted from the organic light emitting layer.

In this case, the intensity of light emitted from the organic light emitting layer may be changed according to a temperature transferred by the temperature transfer unit.

The temperature sensor may further include a temperature intercept unit located between the temperature transfer unit and the second electrode to intercept temperature transfer to the second electrode from the temperature transfer unit.

Further, the delayed fluorescent material may include at least one selected from the group consisting of SnF2-Copro III, SnF2-Meso IX, SnF2-Hemato IX, SnF2-Proto IX, SnF2-OEP, SnF2-Etiol, 2CzPN, 4CzIPN, 4CzPN, 4CzTPN, 4CzTPN-Me, 4CzTPN-Ph, PXZ-OXD, 2PXZ-OXD, PXZ-TAZ and 2PXZ-TAZ.

Further, the organic light emitting layer may include a host material and a dopant material and the delayed fluorescent material may be the dopant material.

The host material may be an organic light emitting material other than the delayed fluorescent material. The organic light emitting material may include at least one selected from the group consisting of tris(8-hydroxyquinolinato)aluminium (Alq3), 9,10-Di(2-naphthyl)anthracene (ADN), 2-tert-butyl-9,10-di 2-naphthylanthracene (TBADN), (ter(9,9-diarylfluorene) (TDAF), 2-methyl-9,10-di-(2-naphthyl)anthracene (MADN), 3,3'-dibromo-9,9'-spirobifluorene-2,2'-diamine (BSBF), 2,2-bis[4-(4-aminophenoxy)phenyll hexafluoropropane (4-BDAF), 1,3,5-tris(1-pyrenyl]benzene (TPB3), 9,9-Bis[4-(pyrenyl)phenyl]-9H-fluorene (BPPF), N',N'',N'''-tris(pyrid-3-ylmethyl)-1,3,5-benzenetricarboxamide (TPBA), 2,7-Dipyrenyl-9,9-spirobifluorene (Spiro-Pye), 1,4-Di(pyren-1-yl)benzene (p-Bpye), 1,3-Di(pyren-1-yl)benzene (m-Bpye), 6,13-Di-biphenyl-4-yl-pentacene (DBpenta), 3,9-Di(naphthalen-2-yl) perylene and 3,10-di(naphthalen-2-yl) perylene mixture (DNP), 1,1'-(2,5-Dimethyl-1,4-phenylene)dipyrene (DMPPP), Tris[4-(pyrenyl)-phenyl]amine (TPyPA), 10,10'-Di(biphenyl-4-yl)-9,9'-bianthracene (BANE), N,N'-Di-(1-naphthalenyl)-N,N'-diphenyl-[1,1':4',1'':4'',1'''-quaterphenyl]-4,4'''-diamine (4P-NPB), 4,4'-Di[10-(naphthalen-1-yl)anthracen-9-yl]biphenyl (BUBH-3), Dibenzo{[f,f']-4,4',7,7'-tetraphenyl}diindeno[1,2,3-cd:1',2',3'-lm]perylene (DBP), 1-(7-(9,9'-Bianthracen-10-yl)-9,9-dimethyl-9H-fluoren-2-yl)pyrene (BAnFPye), 3-(2-Benzothiazolyl)-7-(diethylamino)coumarin (Coumarin 6), 2,3,6,7-Tetrahydro-1,1,7,7,-tetramethyl-1H,5H,11H-10-(2-benzothiazolyl)quinolizino [9,9a,lgh]coumarin (C545T), N,N'-Dimethyl-quinacridone (DMQA), 9,10-Bis[N,N-di-(p-tolyl)-amino]anthracene (TTPA), 9,10-Bis[phenyl(m-tolyl)-amino]anthracene (TPA), N10,N10,N10',N10'-Tetra-tolyl-9,9'-bianthracene-10,10'-diamine (BA-TTB), N10,N10,N10',N10'-Tetraphenyl-9,9'-bianthracene-10,10'-diamine (BA-TAD), N10,N10'-Diphenyl-N10,N10'-dinaphthalenyl-9,9'-bianthracene-10,10'-diamine (BA-NPB), 4,4'-Bis(9-ethyl-3-carbazovinylene)-1,1'-biphenyl (BCzVBi), Perylene, 2,5,8,11-Tetra-tert-butylperylene (TBPe), 1,4-Bis[2-(3-N-ethylcarbazoryl)vinyl]benzene (BCzVB), 4,4'-Bis[4-(di-p-tolylamino)styryl]biphenyl (DPAVBi), 4-(Di-p-tolylamino)-4'-[(di-p-tolylamino)styryl]stilbene (DPAVB), 4,4'-Bis[4-(diphenylamino)styryl]biphenyl (BDAVBi), N,N'-Bis(naphthalen-2-yl)-N,N'-bis(phenyl)-tris-(9,9-dimethylfluorenylene) (BNP3FL), 2,7-Bis{2-[phenyl(m- tolyl)amino]-9,9-dimethyl-fluorene-7-yl}-9,9-dimethyl-fluorene (MDP3FL), N-(4-((E)-2-(6-((E)-4-(Diphenylamino)styryl)naphthalen-2-yl)vinyl)phenyl)-N-phenylbenzenamine (N-BDAVBi), 2,7-Bis[4-(diphenylamino)styryl]-9,9-spirobifluorene (Spiro-BDAVBi), 6-Methyl-2-(4-(9-(4-(6-methylbenzo[d]thiazol-2-yl) phenyl)anthracen-10-yl)phenyl)benzo[d]thiazole (DBzA), 1-4-Di-[4-(N,N-diphenyl)amino]styryl-benzene (DSA-Ph), 1,4-Bis(4-(9H-carbazol-9-yl)styryl)benzene (BCzSB), (E)-6-(4-(Diphenylamino)styryl)-N,N-diphenyl-naphthalen-2-amine (DPASN), Bis(2-(2-hydroxyphenyl)-pyridine)beryllium (Bepp2), (E)-2-(2-(4-(Dimethylamino)styryl)-6-methyl-4H-pyran-4-ylidene)malononitrile (DCM), 4-(Dicyanomethylene)-2-methyl-6-julolidyl-9-enyl-4H-pyran (DCM2), 4-(Dicyanomethylene)-2-methyl-6-(1,1,7,7-tetramethyljulolidyl-9-enyl)-4H-pyran (DCJT), 4-(dicyanomethylene)-2-tert-butyl-6-(1,1,7,7-tetramethyljulolidyl-9-enyl)-4H-pyran (DCJTB), 5,6,11,12-Tetraphenylnaphthacene (Rubrene), (E)-2-(2-tert-Butyl-6-(2-(2,6,6-trimethyl-2,4,5,6-tetrahydro-1H-pyrrolo[3,2,1-ij]quinolin-8-yl)vinyl)-4H-pyran-4-ylidene)malononitrile (DCQTB), Tris(2,4,6-trimethyl-3-(pyridin-3-yl)phenyl)borane (3TPYMB), Diphenyl-4-triphenylsilylphenyl-phosphine oxide (TSPO1), Di-[4-(N,N-di-p-tolyl-amino)-phenyl]cyclohexane (TAPC), 9-(3-(9H-Carbazol-9-yl)phenyl)-3-(diphenylphosphoryl)-9H-carbazole (mCPP01), 1,3-Bis(carbazol-9-yl)benzene (mCP), 3,5-Di(9H-carbazol-9-yl)biphenyl (Ph-mCP), 4,4'-Bis(carbazol-9-yl)biphenyl (CBP), 2,2',7,7'-Tetrakis(carbazol-9-yl)-9,9-spirobifluorene (Spiro-CBP), and 2,2',2"-(1,3,5-Benzinetriyl)-tris(1-phenyl-1-H-benzimidazole) (TPBi).

Further, the organic light emitting layer may include a host material and a dopant material and the delayed fluorescent material may be the host material.

The dopant material may be an organic light emitting material other than the delayed fluorescent material. The organic light emitting material may include at least one selected from the group consisting of tris(8-hydroxyquinolinato)aluminium (Alq3), 9,10-Di(2-naphthyl)anthracene (ADN), 2-tert-butyl-9,10-di 2-naphthylanthracene (TBADN), (ter(9,9-diarylfluorene) (TDAF), 2-methyl-9,10-di-(2-naphthyl)anthracene (MADN), 3,3'-dibromo-9,9'-spirobifluorene-2,2'-diamine (BSBF), 2,2-bis[4-(4-aminophenoxy)phenyl] hexafluoropropane (4-BDAF), 1,3,5-tris(1-pyrenyl]benzene (TPB3), 9,9-Bis[4-(pyrenyl)phenyl]-9H-fluorene (BPPF), N',N''',N''''-tris(pyrid-3-ylmethyl)-1,3,5-benzenetricarboxamide (TPBA), 2,7-Dipyrenyl-9,9-spirobifluorene (Spiro-Pye), 1,4-Di(pyren-1-yl)benzene (p-Bpye), 1,3-Di(pyren-1-yl)benzene (m-Bpye), 6,13-Di-biphenyl-4-yl-pentacene (DBpenta), 3,9-Di(naphthalen-2-yl) perylene and 3,10-di(naphthalen-2-yl) perylene mixture (DNP), 1,1'-(2,5-Dimethyl-1,4-phenylene)dipyrene (DMPPP), Tris[4-(pyrenyl)-phenyl]amine (TPyPA), 10,10'-Di(biphenyl-4-yl)-9,9'-bianthracene (BANE), N,N'-Di-(1-naphthalenyl)-N,N'-diphenyl-[1,1':4',1":4",1"''-quaterphenyl]-4,4'''-diamine (4P-NPB), 4,4'-Di[10-(naphthalen-1-yl)anthracen-9-yl]biphenyl (BUBH-3), Dibenzo{[f,f']-4,4',7,7'-tetraphenyl}diindeno[1,2,3-cd:1',2',3'-lm]perylene (DBP), 1-(7-(9,9'-Bianthracen-10-yl)-9,9-dimethyl-9H-fluoren-2-yl)pyrene (BAnFPye), 3-(2-Benzothiazolyl)-7-(diethylamino)coumarin (Coumarin 6), 2,3,6,7-Tetrahydro-1,1,7,7,-tetramethyl-1H,5H,11H-10-(2-benzothiazolyl)quinolizino[9,9a,1gh]coumarin (C545T), N,N'-Dimethyl-quinacridone (DMQA), 9,10-Bis[N,N-di-(p-tolyl)-amino]anthracene (TTPA), 9,10-Bis[phenyl(m-tolyl)-amino]anthracene (TPA), N10,N10,N10',N10'-Tetra-tolyl-9,9'-bianthracene-10,10'-diamine (BA-TTB), N10,N10,N10',N10'-Tetraphenyl-9,9'-bianthracene-10,10'-diamine (BA-TAD), N10,N10'-Diphenyl-N10,N10'-dinaphthalenyl-9,9'-bianthracene-10,10'-diamine (BA-NPB), 4,4'-Bis(9-ethyl-3-carbazovinylene)-1,1'-biphenyl (BCzVBi), Perylene, 2,5,8,11-Tetra-tert-butylperylene (TBPe), 1,4-Bis[2-(3-N-ethylcarbazoryl)vinyl]benzene (BCzVB), 4,4'-Bis[4-(di-p-tolylamino)styryl]biphenyl (DPAVBi), 4-(Di-p-tolylamino)-4'-[(di-p-tolylamino)styryl]stilbene (DPAVB), 4,4'-Bis[4-(diphenylamino)styryl]biphenyl (BDAVBi), N,N'-Bis(naphthalen-2-yl)-N,N'-bis(phenyl)-tris-(9,9-dimethylfluorenylene) (BNP3FL), 2,7-Bis{2-[phenyl(m-tolyl)amino]-9,9-dimethyl-fluorene-7-yl}-9,9-dimethyl-fluorene (MDP3FL), N-(4-((E)-2-(6-((E)-4-(Diphenylamino)styryl)naphthalen-2-yl)vinyl)phenyl)-N-phenylbenzenamine (N-BDAVBi), 2,7-Bis[4-(diphenylamino)styryl]-9,9-spirobifluorene (Spiro-BDAVBi), 6-Methyl-2-(4-(9-(4-(6-methylbenzo[d]thiazol-2-yl) phenyl)anthracen-10-yl)phenyl)benzo[d]thiazole (DBzA), 1-4-Di-[4-(N,N-diphenyl)amino]styryl-benzene (DSA-Ph), 1,4-Bis(4-(9H-carbazol-9-yl)styryl)benzene (BCzSB), (E)-6-(4-(Diphenylamino)styryl)-N,N-diphenyl-naphthalen-2-amine (DPASN), Bis(2-(2-hydroxyphenyl)-pyridine)beryllium (Bepp2), (E)-2-(2-(4-(Dimethylamino)styryl)-6-methyl-4H-pyran-4-ylidene)malononitrile (DCM), 4-(Dicyanomethylene)-2-methyl-6-julolidyl-9-enyl-4H-pyran (DCM2), 4-(Dicyanomethylene)-2-methyl-6-(1,1,7,7-tetramethyljulolidyl-9-enyl)-4H-pyran (DCJT), 4-(dicyanomethylene)-2-tert-butyl-6-(1,1,7,7-tetramethyljulolidyl-9-enyl)-4H-pyran (DCJTB), 5,6,11,12-Tetraphenylnaphthacene (Rubrene), and (E)-2-(2-tert-Butyl-6-(2-(2,6,6-trimethyl-2,4,5,6-tetrahydro-1H-pyrrolo[3,2,1-ij]quinolin-8-yl)vinyl)-4H-pyran-4-ylidene)malononitrile (DCQTB).

The organic light emitting layer may be a multilayered structure.

The temperature sensor unit may further include an electron transport layer located on the organic light emitting layer and a hole transport layer located below the organic light emitting layer.

The hole transport layer may include at least one selected from the group consisting of N,N'-Bis(naphthalen-1-yl)-N,N'-bis(phenyl)-benzidine (NPB), N,N'-Bis(naphthalen-2-yl)-N,N'-bis(phenyl)-benzidine (β-NPB), N,N'-Bis(3-methylphenyl)-N,N'-bis(phenyl)-benzidine (TPD), N,N'-Bis(3-methylphenyl)-N,N'-bis(phenyl)-2,7-diamino-9,9-spirobifluorene (Spiro-TPD), N,N'-Bis(naphthalen-1-yl)-N,N'-bis(phenyl)-2,7-diamino-9,9-spirobifluorene (Spiro-NPB), N,N'-Bis(3-methylphenyl)-N,N'-bis(phenyl)-2,7-diamino-9,9-dimethyl-fluorene (DMFL-TPD), N,N'-Bis(naphthalen-1-yl)-N,N'-bis(phenyl)-2,7-diamino-9,9-dimethyl-fluorene (DMFL-NPB), N,N'-Bis(3-methylphenyl)-N,N'-bis(phenyl)-2,7-diamino-9,9-diphenyl-fluorene (DPFL-TPD), N,N'-Bis(naphthalen-1-yl)-N,N'-bis(phenyl)-2,7-diamino-9,9-diphenyl-fluorene (DPFL-NPB), N,N'-Bis(naphthalen-1-yl)-N,N'-bis(phenyl)-2,2'-dimethyl-benzidine (α-NPD), 2,2',7,7'-Tetrakis(N,N-diphenylamino)-2,7-diamino-9,9-spirobifluorene (Spiro-TAD), 9,9-Bis[4-(N,N-bis-naphthalen-2-yl-amino)phenyl]-9H-fluorene (NPAPF), 9,9-Bis[4-(N-naphthalen-1-yl-N-phenylamino)-phenyl]-9H-fluorene (NPBAPF), 2,2',7,7'-Tetrakis[N-naphthalenyl(phenyl)-amino]-9,9-spirobifluorene (Spiro-2NPB), N,N'-Bis(phenanthren-9-yl)-N,N'-bis(phenyl)-benzidine (PAPB), 2,2'-Bis[N,N-bis(biphenyl-4-yl)amino]-9,9-spirobifluorene (2,2'-Spiro-DBP), 2,2'-Bis(N,N-di-phenyl-amino)-9,9-spirobifluorene (Spiro-BPA), Di-[4-(N,N-di-p-tolyl-amino)-phenyl]cyclohexane (TAPC), 2,2',7,7'-Tetra(N,N-di-p-tolyl)amino-9,9-spirobifluorene (Spiro-TTB), N,N, N',N'-Tetra-naphthalen-2-yl-benzidine (β-TNB), N,N,N',N'-Tetra-(3-methylphenyl)-3,3'-dimethylbenzidine (HMTPD), N,N'-Di(naphthalenyl)-N,N'-di(naphthalen-2-yl)-benzidine (α,β-TNB), N,N,N',N'-Tetra-naphthalen-2-yl-benzidine (β-TNB), N,N'-Di(naphthalen-2-yl)-N,N'-diphenylbenzene-1,4-diamine (β-NPP), Poly(3,4-ethylenedioxythiophene)-poly(styrenesulfonate) (PEDOT:PSS), Poly(9-vinylcarbazole) (PVK), WO3, NiO2, Mo and MoO3.

The electron transport layer may include at least one selected from the group consisting of C60, C70, PCBM (C60), PCBM(C70), PCBM(C75), PCBM(C80), Liq, 2,2',2"-(1,3,5-Benzinetriyl)-tris(1-phenyl-1-H-benzimidazole) (TPBi), 2-(4-Biphenyl)-5-(4-tert-butylphenyl)-1,3,4-oxadiazole (PBD), 2,9-Dimethyl-4,7-diphenyl-1,10-phenanthroline (BCP), 4,7-Diphenyl-1,10-phenanthroline (Bphen), Bis(2-methyl-8-quinolinolate)-4-(phenylphenolato) aluminium (BAlq), 1,3-Bis[2-(2,2'-bipyridine-6-yl)-1,3,4-oxadiazo-5-yl]benzene (Bpy-OXD), 6,6'-Bis[5-(biphenyl-4-yl)-1,3,4-oxadiazo-2-yl]-2,2'-bipyridyl (BP-OXD-Bpy), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 2,9-Bis(naphthalen-2-yl)-4,7-diphenyl-1,10-phenanthroline (NBphen), 2,7-Bis[2-(2,2'-bipyridine-6-yl)-1,3,4-oxadiazo-5-yl]-9,9-dimethylfluorene (Bpy-FOXD), Tris(2,4,6-trimethyl-3-(pyridin-3-yl)phenyl)borane (3TPYMB), 1-Methyl-2-(4-(naphthalen-2-yl)phenyl)-1H-imidazo[4,5f] [1,10]phenanthroline (2-NPIP), 2-(Naphthalen-2-yl)-4,7-diphenyl-1,10-phenanthroline (HNBphen), Phenyl-dipyrenylphosphine oxide (POPy2), 3,3',5,5'-Tetra[(m-pyridyl)-phen-3-yl]biphenyl (BP4mPy), 1,3,5-Tri[(3-pyridyl)-phen-3-yl]benzene (TmPyPB) and 4,4'-Bis(4,6-diphenyl-1,3,5-triazin-2-yl)biphenyl (BTB).

The light intensity measuring unit may determine a temperature according to a change in the intensity of light emitted from the light emitting layer.

The temperature transfer unit may be an organic substrate including any one selected from the group consisting of polyethyleneterephthalate (PET), polystyrene (PS), polyimide (PI), polyvinylchloride (PVC), polyvinylpyrolidon (PVP) and polyethlyene (PE).

Further, the temperature transfer unit may be a conductive thin film substrate including any one selected from the group consisting of Al, Au, Ag, Cu, Pt, W, Ni, Zn, Ti, Zr, Hf, Cd and Pd.

The first electrode may include at least one selected from the group consisting of Al, Au, Ag, Cu, Pt, W, Ni, Zn, Ti, Zr, Hf, Cd and Pd.

The second electrode may be a transparent electrode. The second electrode may include at least one selected from the group consisting of ITO, Al-doped ZnO (AZO), Ga-doped ZnO (GZO), In, Ga-doped ZnO (IGZO), Mg-doped ZnO (MZO), Mo-doped ZnO, Al-doped MgO, Ga-doped MgO, F-doped SnO2, Nb-doped TiO2 and CuAlO2.

The first electrode and the second electrode may include graphene, CNT and C60.

The first electrode and the second electrode may have a multilayered structure of CuAlO2/Ag/CuAlO2, ITO/Ag/ITO, ZnO/Ag/ZnO, ZnS/Ag/ZnS, TiO2/Ag/TiO2, ITO/Au/ITO, WO3/Ag/WO3 or MoO3/Ag/MoO3.

Another exemplary embodiment of the present disclosure provides a method for manufacturing a temperature sensor. The method for manufacturing a temperature sensor may include forming a sensor unit including an organic light emitting layer including a delayed fluorescent material on a first electrode substrate; forming a temperature transfer unit transferring an external temperature to the sensor unit in a partial area on the sensor unit; forming a temperature intercept unit formed on the sensor unit to be adjacent to the side of the temperature transfer unit; forming a second electrode formed on the sensor unit to be adjacent to the side of the temperature intercept unit which being spaced apart from the temperature transfer unit; and forming a light intensity measuring unit on the second electrode to measure intensity of light emitted from the organic light emitting layer. The temperature intercept unit may intercept the temperature transfer to the second electrode from the temperature transfer unit.

Further, the intensity of light emitted from the organic light emitting layer may be changed according to a temperature transferred by the temperature transfer unit.

Further, the delayed fluorescent material may include at least one selected from the group consisting of SnF2-Copro III, SnF2-Meso IX, SnF2-Hemato IX, SnF2-Proto IX, SnF2-OEP, SnF2-Etiol, 2CzPN, 4CzIPN, 4CzPN, 4CzTPN, 4CzTPN-Me, 4CzTPN-Ph, PXZ-OXD, 2PXZ-OXD, PXZ-TAZ and 2PXZ-TAZ.

Further, the forming of the sensor unit may include: forming an electron transport layer on the first electrode substrate; forming an organic light emitting layer including a delayed fluorescent material on the electron transport layer; and forming a hole transport layer on the organic light emitting layer.

Yet another exemplary embodiment of the present disclosure provides an organic light emitting display. The organic light emitting display includes pixels having organic light emitting diodes and driving circuits operating the organic light emitting diodes; and the temperature sensors, in which the temperature sensor is located in at least one of an active area where the pixels are disposed and an inactive area around the active area.

The temperature sensor may be located in the active area and the temperature sensor may operate an element displaying an image and an element detecting an ambient temperature.

The first electrode or the second electrode of the temperature sensor may be connected with a driving transistor included in the driving circuit.

The organic light emitting display may further include a controller compensating for changes of characteristics of the organic light emitting diode or the driving circuit based on the temperature detected by the temperature sensor.

The temperature sensors may be located at a plurality of points in the active area, and the controller may compensate for changes in characteristics of the organic light emitting diode or the driving circuit individually for each zone set corresponding to the temperature sensors.

In this case, the characteristics of the organic light emitting diode or the driving circuit may include at least one of a threshold voltage of the organic light emitting diode, mobility of the transistor, and a threshold voltage of the transistor.

The organic light emitting display may further include a controller adjusting luminance of the image displayed by the pixel based on the temperature detected by the temperature sensor.

The organic light emitting display may further include a controller compensating for a deterioration value according to the temperature of the organic light emitting diode or the driving circuit based on the temperature detected by the temperature sensor.

Details of other exemplary embodiments will be included in the detailed description of the present disclosure and the accompanying drawings.

According to the exemplary embodiment of the present disclosure, a temperature sensor with improved sensitivity can be provided by measuring the temperature based upon a change in the intensity of light using delayed fluorescence.

Further, according to the exemplary embodiment of the present disclosure, the organic light emitting layer is formed by doping a delayed fluorescent material to the host or doping an organic light emitting material using the delayed fluorescent material as a host, thereby providing a temperature sensor with more improved sensitivity than a single layer of the delayed fluorescent material.

Further, according to the exemplary embodiment of the present disclosure, a temperature sensor with high sensitivity can be manufactured at a simple process and low cost.

Further, according to the exemplary embodiment of the present disclosure, a transparent type temperature sensor may be provided by using a transparent temperature transfer unit and a transparent electrode.

Further, according to the exemplary embodiment of the present disclosure, a sensor unit material is used as an organic material, thereby implementing a flexible device.

The effects of the present disclosure are not limited to the aforementioned effects, and other effects, which are not mentioned above, will be apparent to a person having ordinary skill in the art from the following description.

DETAILED DESCRIPTION OF THE EMBODIMENTS

Figure 1:
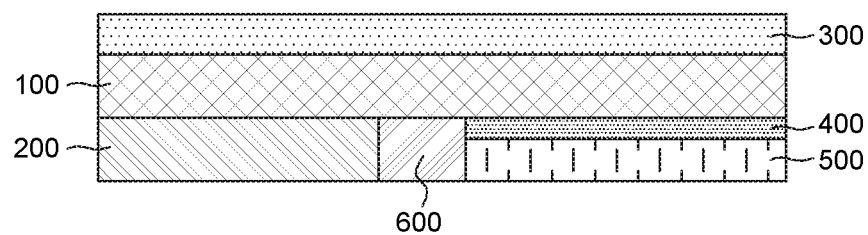
FIG. 1 is a cross-sectional view of a temperature sensor according to an exemplary embodiment of the present disclosure.

The advantages and features of the present disclosure, and a method of accomplishing these will become obvious with reference to embodiments to be described below in detail along with the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure can be defined by the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present disclosure. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

Since size and thickness of each component illustrated in the drawings are represented for convenience in explanation, the present disclosure is not necessarily limited to the illustrated size and thickness of each component.

While the present disclosure permits various modifications and variations, specific exemplary embodiments thereof are exemplified in the drawings and will hereinafter be described in detail. However, the present disclosure is not intended to be limited to specific forms, but rather, the present disclosure includes various modifications, equivalents and substitutions that are consistent with the scope of the present disclosure as defined by the claims.

It will be understood that when an element such as a layer, an area or a substrate is referred to as being present "on" another element, the element may be directly present on another element or there may be an intermediate element therebetween.

Although the terms of the first, second, and the like may be used to describe various elements, components, areas, layers and/or regions, but it will be understood that these elements, components, areas, layers and/or regions should not be limited by these terms.

The features of various exemplary embodiments of the present disclosure can be partially or entirely bonded to or combined with each other and can be interlocked and operated in technically various ways, and the exemplary embodiments can be carried out independently of or in association with each other. Hereinafter, exemplary embodiments of the present disclosure will be described in detail with reference to the accompanying drawings.

FIG. 1 is a schematic cross-sectional view of a temperature sensor according to an exemplary embodiment of the present disclosure.

Referring to FIG. 1, a temperature sensor according to an exemplary embodiment of the present disclosure may include a sensor unit 100, a temperature transfer unit 200, a first electrode 300, a second electrode 400, a light intensity measuring unit 500, and a temperature intercept unit 600.

The sensor unit 100 may include an organic light emitting layer including a delayed fluorescent material. Accordingly, an intensity of light emitted from the organic light emitting layer is changed according to a temperature transferred by the temperature transfer unit 200 to be described below.

That is, the delayed fluorescent material is included in the organic light emitting layer, and when an external temperature is transferred to the organic light emitting layer, interplanar transition efficiency of delayed fluorescence is changed by the external temperature to change the intensity of light emitted from the organic light emitting layer. That is, light emission efficiency of the organic light emitting layer is changed. Accordingly, the change in intensity of light or light emission efficiency of the organic light emitting layer is measured by the light intensity measuring unit 500 to be described above to detect a change in temperature. For example, a temperature change can be seen by matching the change of the intensity of light measured by the light intensity measuring unit 500 with a predetermined reference.

For example, the delayed fluorescent material may include at least one selected from the group consisting of SnF2-Copro III, SnF2-Meso IX, SnF2-Hemato IX, SnF2-Proto IX, SnF2-OEP, SnF2-Etiol, 2CzPN, 4CzIPN, 4CzPN, 4CzTPN, 4CzTPN-Me, 4CzTPN-Ph, PXZ-OXD, 2PXZ-OXD, PXZ-TAZ and 2PXZ-TAZ.

Meanwhile, the organic light emitting layer may be used as a single layer made of only a delayed fluorescent material, but in order to provide the temperature sensor having higher sensitivity, the organic light emitting layer may include a host material and a dopant material. Accordingly, the delayed fluorescent material is any one of the host material and the dopant material, and an organic light emitting material other than the delayed fluorescent material is the other one of the dopant material and the host material to form the organic light emitting layer.

In this case, a criterion for defining two kinds of materials as the host material and the dopant material is a size of an energy band gap. That is, a material having a relatively large energy band gap may be the host material and a material having a relatively small energy band gap may be the dopant material.

Accordingly, an organic light emitting layer configured by doping a delayed fluorescent material (a dopant) to an organic light emitting material (a host) other than the delayed fluorescent material may have a higher light intensity and more improved temperature sensitivity than an organic light emitting layer configured by only the delayed fluorescent material.

Further, in the case of the organic light emitting layer configured by doping an organic light emitting material (dopant) other than the delayed fluorescent material by using the delayed fluorescent material as a host, the energy of the delayed fluorescent material is efficiently transited to the organic light emitting material (dopant) to adjust the light intensity and the light wavelength.

For example, the organic light emitting layer includes the host material and the dopant material and the delayed fluorescent material may be the dopant material. In addition, the host material may be the organic light emitting material other than the delayed fluorescent material. In the case, the organic light emitting material may include at least one selected from the group consisting of Alq3, ADN, TBADN, TDAF, MADN, BSBF, 4-BDAF, TPB3, BPPF, TPBA, Spiro-Pye, p-Bpye, m-Bpye, DBpenta, DNP, DMPPP, TPyPA, BANE, 4-NPB, BUBH-3, DBP, BAnFPye, Coumarin 6, C545T, DMQA, TTPA, TPA, BA-TTB, BA-TAD, BA-NPB, BCzVBi, Perylene, TBPe, BCzVB, DPAVBi, DPAVB, FIrPic, BDAVBi, BNP3FL, MDP3FL, N-BDAVBi, Spiro-BDAVBi, DBzA, DSA-Ph, BCzSB, DPASN, Bepp2, DCM, DCM2, DCJT, DCJTB, Rubrene, DCQTB, 3TPYMB, TSPO1, TAPC, mCPP01, Ph-mCP, CBP, Spiro-CBP and TPBi.

As another example, the organic light emitting layer includes a host material and a dopant material and the delayed fluorescent material may be the host material. In addition, the dopant material may be the organic light emitting material other than the delayed fluorescent material. In the case, the organic light emitting material may include at least one selected from the group consisting of Alq3, ADN, TBADN, TDAF, MADN, DPVBi, BSBF, 4-BDAF, TPB3, BPPF, TPBA, Spiro-Pye, p-Bpye, m-Bpye, DBpenta, DNP, DMPPP, TPyPA, BANE, 4-NPB, BUBH-3, DBP, BAnFPye, Coumarin 6, C545T, DMQA, TTPA, TPA, BA-TTB, BA-TAD, BA-NPB, BCzVBi, Perylene, TBPe, BCzVB, DPAVBi, DPAVB, BDAVBi, BNP3FL, MDP3FL, N-BDAVBi, Spiro-BDAVBi, DBzA, DSA-Ph, BCzSB, DPASN, Bepp2, DCM, DCM2, DCJT, DCJTB, Rubrene and DCQTB.

In this regard, combination examples of the host material and the dopant material of the organic light emitting layer may be configured as the following Table 1.

TABLE 1

|  | Host material | Dopant material |
|---|---|---|
| Host: Organic light emitting material | UGH3 | 2CzPN |
| Dopant: Delayed fluorescent material | mCP | 4CzIPN |
|  | TPBi | 2PXZ-OXD |
|  | CBP | 4CzTPN-Ph |
| Host: Delayed fluorescent material | 2CzPN | MADN |
| Dopant: Organic light emitting material | 4CzIPN | Alq$_3$ |
|  | 2PXZ-OXD | Rubrene |
|  | 4CzTPN-Ph | DCM |

Further, the organic light emitting layer 300 may also be formed in a multilayered structure. For example, the organic light emitting layer 300 may be a structure in which different kinds of delayed fluorescent material layers are laminated in multilayer.

Meanwhile, the sensor unit 100 may further include an electron transport layer and a hole transport layer in the organic light emitting layer. A voltage applied when a device is driven by an electric field may be lowered using the hole transport layer and the electron transport layer.

This will be described with reference to FIG. 2.

Figure 2:
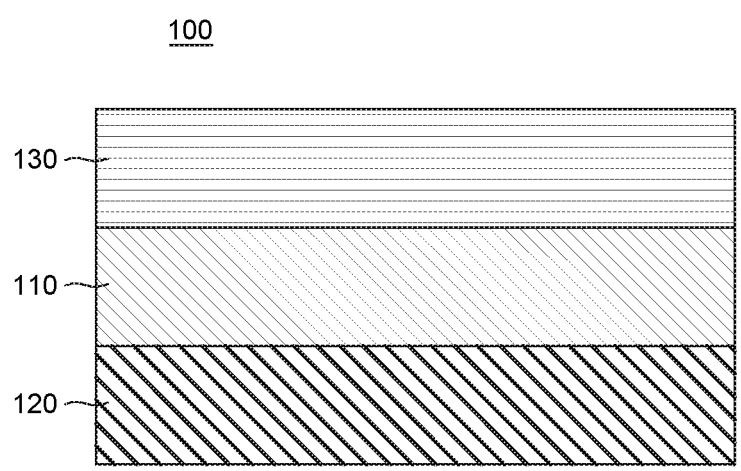
FIG. 2 is a cross-sectional view of a sensor unit of FIG. 1.

FIG. 2 is a schematic cross-sectional view of the sensor unit. Referring to FIG. 2, the sensor unit 100 may include an organic light emitting layer 110, an electron transport layer 120 located on the organic light emitting layer 110, and a hole transport layer 130 located below the organic light emitting layer 110.

For example, the hole transport layer 130 may include at least one selected from the group consisting of NPB, β-NPB, TPD, Spiro-TPD, Spiro-NPB, DMFL-TPD, DMFL-NPB, DPFL-TPD, DPFL-NPB, a-NPD, Spiro-TAD, BPAPF, NPAPF, NPBAPF, Spiro-2NPB, PAPB, 2,2'-Spiro-DBP, Spiro-BPA, TAPC, Spiro-TTB, β-TNB, HMTPD, α,β-TNB, β-TNB, β-NPP, PEDOT:PSS, PVK, WO3, NiO2, Mo and MoO3.

Further, the electron transport layer 120 may include at least one selected from the group consisting of C60, C70, PCBM(C60), PCBM(C70), PCBM(C75), PCBM(C80), Liq, TPBi, PBD, BCP, Bphen, BAlq, Bpy-OXD, BP-OXD-Bpy, TAZ, NTAZ, NBphen, Bpy-FOXD, 3TPYMB, 2-NPIP, HNBphen, POPy2, BP4mPy, TmPyPB and BTB.

Accordingly, the light emission efficiency is increased by introducing the electron transport layer 120 and the hole transport layer 130, thereby increasing a change rate of the intensity of light emitted from the organic light emitting layer 110 according to a change in the external temperature and further improving sensitivity of the temperature sensor.

Figure 10:
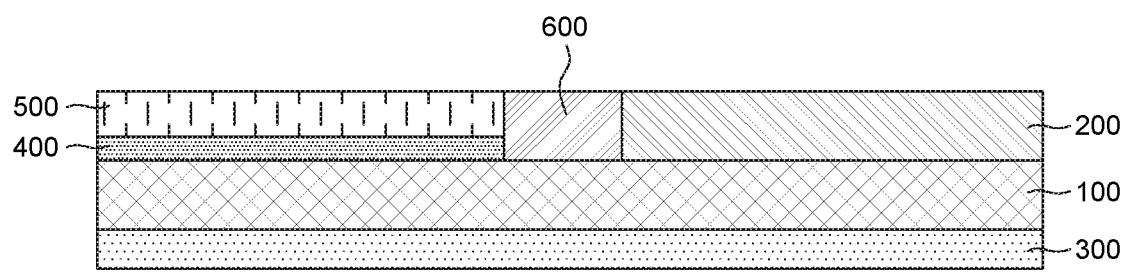

Referring back to FIG. 1, the temperature transfer unit 200 is located below the sensor unit 100 and transfers the external temperature to the sensor unit 100. For example, the temperature transfer unit 200 may be located in a partial area below the sensor unit 100. FIG. 10 also depicts a rotated view of the temperature sensor of FIG. 1.

For example, the temperature transfer unit 200 may be an organic substrate including any one selected from the group consisting of polyethyleneterephthalate (PET), polystyrene (PS), polyimide (PI), polyvinylchloride (PVC), polyvinylpyrolidon (PVP) and polyethlyene (PE). In the case of using the organic substrate, there is an advantage that a flexible device may be manufactured.

The temperature transfer unit 200 includes a conductive material to transfer the external temperature.

As another example, the temperature transfer unit 200 may be a conductive metal substrate including any one selected from the group consisting of Al, Au, Ag, Cu, Pt, W, Ni, Zn, Ti, Zr, Hf, Cd and Pd. The metal substrate may be a thin film substrate formed with a small thickness. Accordingly, the temperature transfer unit 200 may be fabricated with a small thickness to be applied to a flexible device. Further, the temperature transfer unit 200 may use a conductive transparent material and applied to a transparent device.

The first electrode 300 may be located on the sensor unit 100.

As an example, the first electrode 300 may include at least one selected from the group consisting of Al, Au, Ag, Cu, Pt, W, Ni, Zn, Ti, Zr, Hf, Cd and Pd.

As another example, the first electrode 300 may include graphene, CNT and C60.

As another example, the first electrode 300 may be a multilayered structure of CuAlO2/Ag/CuAlO2, ITO/Ag/ITO, ZnO/Ag/ZnO, ZnS/Ag/ZnS, TiO2/Ag/TiO2, ITO/Au/ITO, WO3/Ag/WO3 or MoO3/Ag/MoO3.

The second electrode 400 is located below the sensor unit 100 to be spaced apart from the temperature transfer unit 200. The second electrode 400 may use a material having high transmittance preferably so that the light emitted from the organic light emitting layer of the sensor unit 100 is transmitted to reach the light intensity measuring unit 500 to be described below.

As an example, the second electrode 400 may include at least one selected from the group consisting of ITO, Al-doped ZnO(AZO), Ga-doped ZnO(GZO), In,Ga-doped ZnO (IGZO), Mg-doped ZnO(MZO), Mo-doped ZnO, Al-doped MgO, Ga-doped MgO, F-doped SnO2, Nb-doped TiO2 and CuAlO2.

As another example, the second electrode 400 may include graphene, CNT and C60.

As yet another example, the second electrode 400 may be a multilayered structure of CuAlO2/Ag/CuAlO2, ITO/Ag/ITO, ZnO/Ag/ZnO, ZnS/Ag/ZnS, TiO2/Ag/TiO2, ITO/Au/ITO, WO3/Ag/WO3 or MoO3/Ag/MoO3.

The light intensity measuring unit 500 is located below the second electrode 400 to measure an intensity of light emitted from the organic light emitting layer 110 (FIG. 2). Accordingly, the light intensity measuring unit 500 may determine a temperature according to a change in intensity of light emitted from the organic light emitting layer 110 (FIG. 2). That is, the light intensity measuring unit 500 may detect a change in the external temperature through a change in intensity of light emitted from the sensor unit 110.

For example, the light intensity measuring unit 500 may use various known photodetectors.

Such a photodetector is located below the second electrode 400 in a thin film form to implement a flexible device.

For example, the photodetector may use a thin film type light measuring device having a structure of PEDOT:PSS/P3HT/PCBM/Al.

The temperature intercept unit 600 is located between the temperature transfer unit 200 and the second electrode 400 to intercept the temperature transfer to the second electrode 400 from the temperature transfer unit 200. Also, since the light intensity measuring unit 500 is disposed below the second electrode 400, the temperature intercept unit 600 may intercept the temperature transfer to the light intensity measuring unit 500 from the temperature transfer unit 200.

Accordingly, the temperature intercept unit 600 may be made of an insulating material so as to intercept the temperature transfer.

For example, the temperature intercept unit 600 may use a non-metallic material such as styrofoam, textile materials, and aerogels or a non-metallic material coating material.

Accordingly, while a voltage is applied to the first electrode 300 and the second electrode 400, light is emitted from the organic light emitting layer 110 of the sensor unit 100, and the light emitted from the organic light emitting layer 110 is detected by the light intensity measuring unit 500. In addition, when the external temperature transferred from the temperature transfer unit 200 is changed, the light emission efficiency of the organic light emitting layer 110 is changed and the amount of emitted light is changed. Accordingly, the changed intensity of light is detected by the light intensity measuring unit 500 to measure a change in temperature by using the change in intensity of light.

Figure 3:
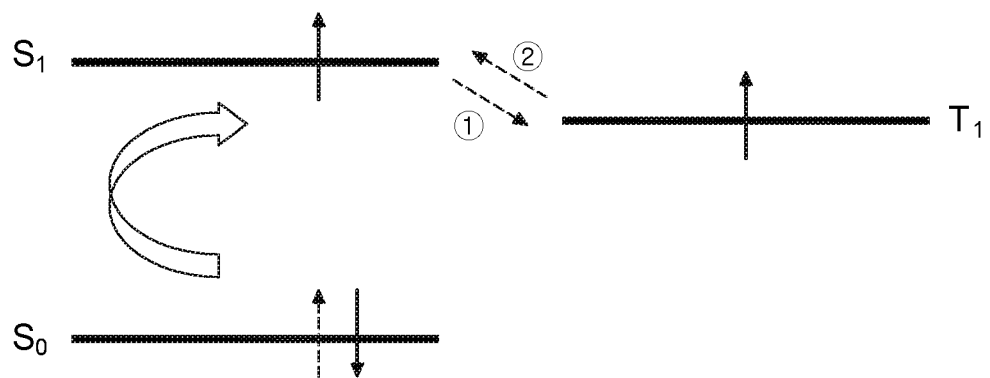
FIG. 3 is a schematic diagram for describing a driving principle of the temperature sensor using delayed fluorescence according to an embodiment of the present disclosure.

FIG. 3 is a schematic diagram for describing a driving principle of the temperature sensor using delayed fluorescence.

FIG. 3 illustrates a case of using a delayed fluorescent material as the organic light emitting layer.

Referring to FIG. 3, electrons excited from a ground state S0 to a singlet state S1 are transformed into a triplet state T1 through an interplanar transition (dotted arrow ①) before being stabilized to the S0 state.

In general, the electrons in the excited state in the T1 state are degraded or dissipated, and when an energy difference between the T1 state and the S1 state of the organic material is controlled, the electrons of T1 cause an interplanar transition (dotted arrow ②) and are moved and stabilized to emit light, and this light emitting process refers to delayed fluorescence.

At this time, interplanar transition efficiency is associated with the energy difference between the T1 state and the S1 state and the efficiency is changed by the external temperature.

Accordingly, the interplanar transition efficiency is changed according to a change in external temperature by using the delayed fluorescent material as the organic light emitting layer, and as a result, the external temperature may be detected by using the changed light emission efficiency.

Figure 4:
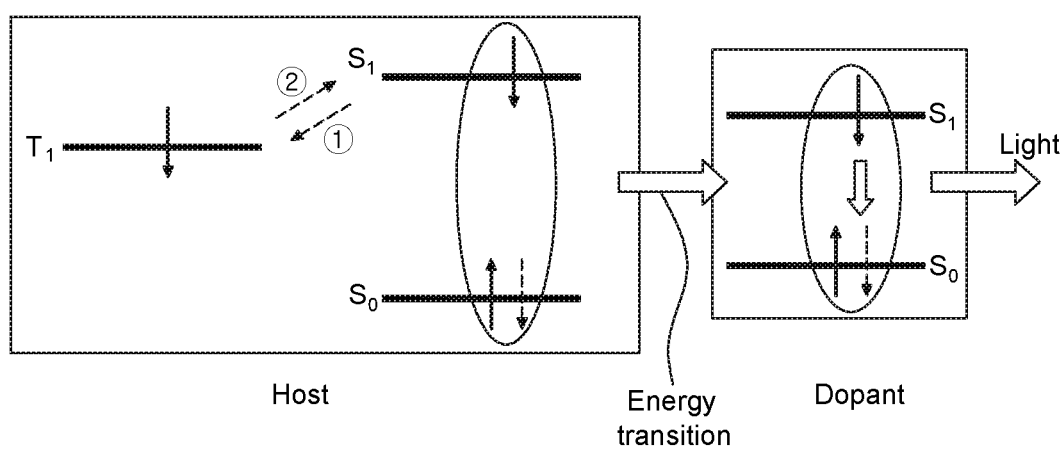
FIG. 4 is another schematic diagram for describing a driving principle of the temperature sensor using delayed fluorescence according to an embodiment of the present disclosure.

FIG. 4 is another schematic diagram for describing a driving principle of the temperature sensor using delayed fluorescence.

FIG. 4 illustrates a case where a delayed fluorescent material is used as a host material and an organic light emitting material other than the delayed fluorescent material is used as a dopant material.

Referring to FIG. 4, the description for a principle of delayed fluorescence of the host is described above in FIG. 3 and will be described. FIG. 4 illustrates a case where the delayed fluorescent material is the host material and the organic light emitting material other than the delayed fluorescent material is the dopant material, and in the host material, while the interplanar transition efficiency is changed by the temperature transferred from the outside, the amount of emitted light is changed. In this case, the light emitted from the host material is energy-transited to the dopant material and the dopant material emits the light again through the received energy. As a result, a change in intensity of light emitted from the dopant material is measured by the light intensity measuring unit.

Accordingly, in this case, there is an advantage in adjusting the light intensity and the light emitting wavelength by using various dopants.

FIGS. 5 to 10 are cross-sectional views illustrating a method for manufacturing a temperature sensor according to an exemplary embodiment of the present disclosure.

Figure 5:
FIGS. 5 to 10 are cross-sectional views illustrating a method for manufacturing a temperature sensor according to an exemplary embodiment of the present disclosure.

Referring to FIG. 5, the first electrode 300 is prepared as the substrate 300 for a device process. For example, an Al metal foil may be prepared as the first electrode substrate 300. In this case, a cleaning process and a drying process may be performed to vacuum-deposit an organic material on the first electrode substrate 300.

Figure 6:
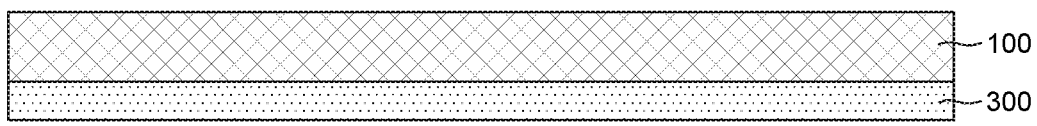

Referring to FIG. 6, next, the sensor unit 100 including an organic light emitting layer including a delayed fluorescent material may be formed on the first electrode substrate 300. Accordingly, the sensor unit 100 includes the delayed fluorescent material, and thus the intensity of light emitted from the organic light emitting layer is changed according to the temperature transferred by the temperature transfer unit 200 to be described below.

For example, the organic light emitting layer may be formed by various methods such as a vacuum deposition method, a spin coating method, a casting method, a Langmuir-Blodgett (LB) method, a spray coating method, a dip coating method, a gravure coating method, a reverse offset coating method, a screen printing method, a slot-die coating method, and a nozzle printing method.

In this case, the delayed fluorescent material may include at least one selected from the group consisting of SnF2-Copro III, SnF2-Meso IX, SnF2-Hemato IX, SnF2-Proto IX, SnF2-OEP, SnF2-Etiol, 2CzPN, 4CzIPN, 4CzPN, 4CzTPN, 4CzTPN-Me, 4CzTPN-Ph, PXZ-OXD, 2PXZ-OXD, PXZ-TAZ and 2PXZ-TAZ.

For example, the organic light emitting layer includes a host material and a dopant material and the delayed fluorescent material may be the dopant material. In addition, the host material may be the organic light emitting material other than the delayed fluorescent material. In the case, the organic light emitting material may include at least one selected from the group consisting of Alq3, ADN, TBADN, TDAF, MADN, BSBF, 4-BDAF, TPB3, BPPF, TPBA, Spiro-Pye, p-Bpye, m-Bpye, DBpenta, DNP, DMPPP, TPyPA, BANE, 4P-NPB, BUBH-3, DBP, BAnFPye, Coumarin 6, C545T, DMQA, TTPA, TPA, BA-TTB, BA-TAD, BA-NPB, BCzVBi, Perylene, TBPe, BCzVB, DPAVBi, DPAVB, FlrPic, BDAVBi, BNP3FL, MDP3FL, N-BDAVBi, Spiro-BDAVBi, DBzA, DSA-Ph, BCzSB, DPASN, Bepp2, DCM, DCM2, DCJT, DCJTB, Rubrene, DCQTB, 3TPYMB, TSPO1, TAPC, mCPP01, Ph-mCP, CBP, Spiro-CBP and TPBi.

As another example, the organic light emitting layer includes a host material and a dopant material and the delayed fluorescent material may be the host material. In addition, the dopant material may be the organic light emitting material other than the delayed fluorescent material. In the case, the organic light emitting material may include at least one selected from the group consisting of Alq3, ADN, TBADN, TDAF, MADN, DPVBi, BSBF, 4-BDAF, TPB3, BPPF, TPBA, Spiro-Pye, p-Bpye, m-Bpye, DBpenta, DNP, DMPPP, TPyPA, BANE, 4-NPB, BUBH-3, DBP, BAnFPye, Coumarin 6, C545T, DMQA, TTPA, TPA, BA-TTB, BA-TAD, BA-NPB, BCzVBi, Perylene, TBPe, BCzVB, DPAVBi, DPAVB, BDAVBi, BNP3FL, MDP3FL, N-BDAVBi, Spiro-BDAVBi, DBzA, DSA-Ph, BCzSB, DPASN, Bepp2, DCM, DCM2, DCJT, DCJTB, Rubrene and DCQTB.

Meanwhile, in the forming of the sensor unit 100, an organic auxiliary layer (a hole transport layer and an electron transport layer) may be deposited together with the organic light emitting layer to increase light emission efficiency of the device.

For example, the forming of the sensor unit 100 may include forming an electron transport layer on the first electrode substrate 300, forming an organic light emitting layer including a delayed fluorescent material on the electron transport layer, and forming a hole transport layer on the organic light emitting layer.

The electron transport layer and the hole transport layer may be formed by various methods such as a vacuum deposition method, a spin coating method, a casting method, a Langmuir-Blodgett (LB) method, a spray coating method, a dip coating method, a gravure coating method, a reverse offset coating method, a screen printing method, a slot-die coating method, and a nozzle printing method.

Figure 7:
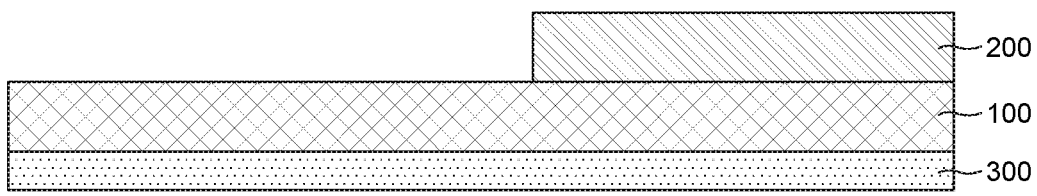

Referring to FIG. 7, the temperature transfer unit 200 that transfers an external temperature to the sensor unit 100 may be formed in a partial area on the sensor unit 100.

The temperature transfer unit 200 may be formed using various known deposition methods. For example, an Ag layer as the temperature transfer unit 200 may be deposited in the partial area on the sensor unit 100 using a shadow mask.

Figure 8:
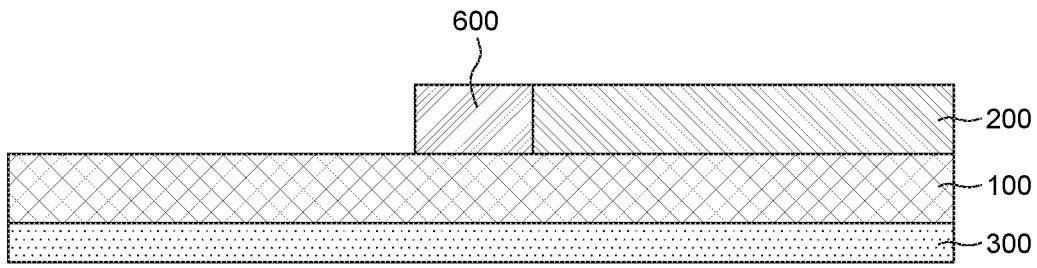

Referring to FIG. 8, the temperature intercept unit 600 may be formed on the sensor unit 100 to be adjacent to the side of the temperature transfer unit 200.

For example, an insulator may be vacuum-deposited on the sensor unit 100 using a shadow mask to be adjacent to the side of the temperature transfer unit 200.

Accordingly, the temperature intercept unit 600 may intercept the temperature transfer to the second electrode 400 to be described below from the temperature transfer unit 200.

Figure 9:
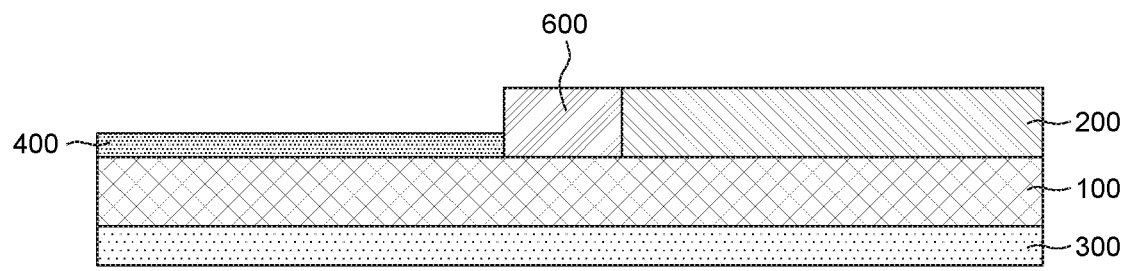

Referring to FIG. 9, the second electrode 400 may be formed on the sensor unit 100 to be adjacent to the side of the temperature intercept unit 600 while being spaced apart from the temperature transfer unit 200. That is, the temperature intercept unit 600 is located between the temperature transfer unit 200 and the second electrode 400 to prevent the external temperature from being transferred to the second electrode 400 from the temperature transfer unit 200.

The second electrode 400 may be formed using a vacuum deposition method, a sputtering method, a vapor deposition method, or an ion beam deposition method.

For example, the second electrode 400 may be formed by vacuum-depositing an electrode material on the sensor unit 100 in an area adjacent to the side of the temperature intercept unit 600 while being spaced apart from the temperature transfer unit 200 by using a shadow mask.

Referring to FIG. 10, the light intensity measuring unit 500 for measuring the intensity of light emitted from the organic light emitting layer of the sensor unit 100 may be formed on the second electrode 400.

The light intensity measuring unit 500 may be formed on the second electrode 400 by performing a solution process.

For example, an organic photodetecting device of PEDOT:PSS/P3HT/PCBM/Al may be used as the light intensity measuring unit 500.

Figure 11:
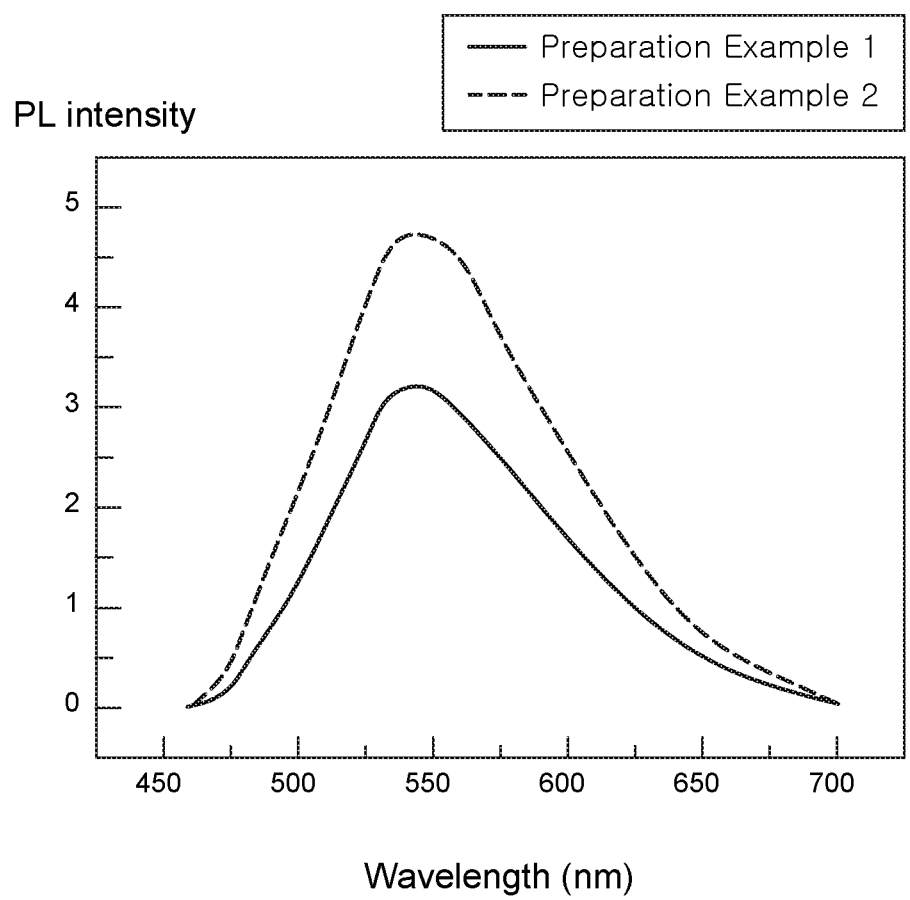
FIG. 11 is a graph obtained by measuring a change in light intensity of a sensor unit in the temperature sensor according to the exemplary embodiment of the present disclosure.

FIG. 11 is a graph obtained by measuring a change in light intensity of the sensor unit in the temperature sensor according to the exemplary embodiment of the present disclosure.

Referring to FIG. 11, changes in light intensity were measured in the case where an organic light emitting layer of the sensor unit was used as a single delayed fluorescent material (Preparation Example 1, solid line) and the case where the delayed fluorescent material was doped to the host as a dopant (Preparation Example 2, dotted line).

In Preparation Example 1, after a TADF delayed fluorescent material was dissolved in an N-methyl-2-pyrrolidone solvent, PL intensity according to a wavelength was measured, and the results were illustrated by a solid line of FIG. 11.

In Preparation Example 2, after a EBCz-ThX host material and a TADF delayed fluorescent material were dissolved in an N-methyl-2-pyrrolidone solvent, PL intensity according to a wavelength was measured, and the results were illustrated by a dotted line of FIG. 11.

Therefore, it can be seen that the case of doping and using the delayed fluorescent material to the host material exhibits higher light intensity than the case of using a single layer of the delayed fluorescent material and a temperature sensor with higher sensitivity can be manufactured.

Figure 12:
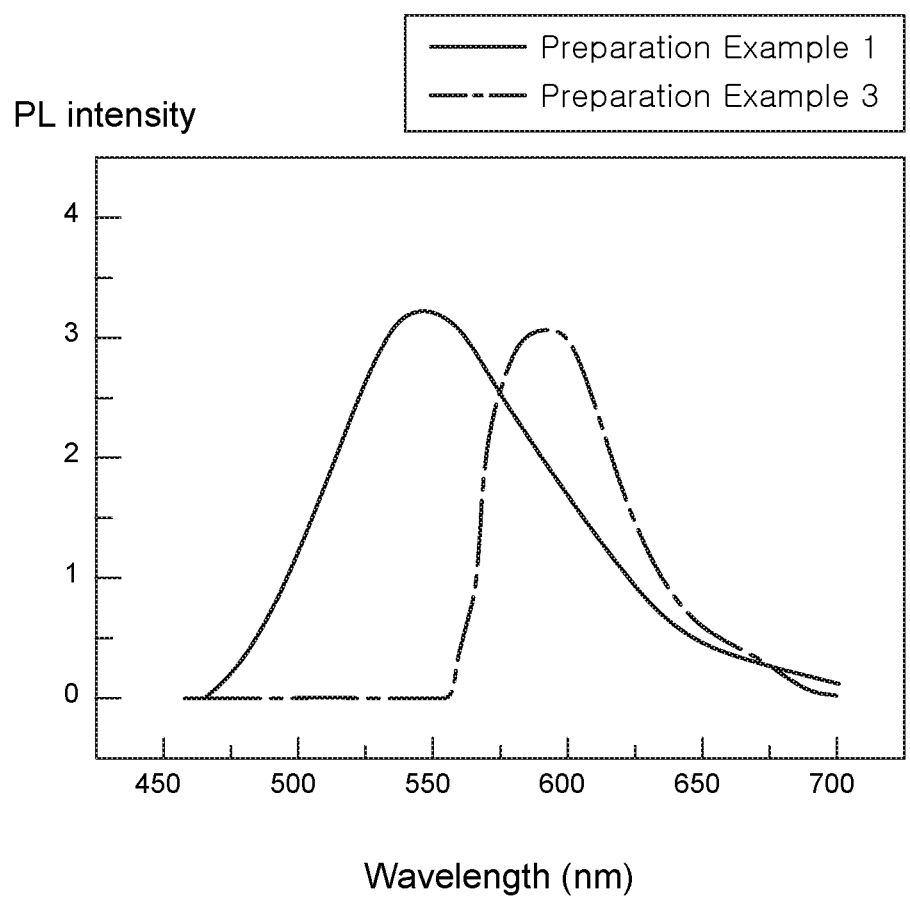
FIG. 12 is a graph obtained by measuring a change in light intensity of a sensor unit in the temperature sensor according to the exemplary embodiment of the present disclosure.

FIG. 12 is a graph obtained by measuring a change in light intensity of the sensor unit in the temperature sensor according to the exemplary embodiment of the present disclosure.

Referring to FIG. 12, changes in light intensity were measured in the case where an organic light emitting layer of the sensor unit was used as a single delayed fluorescent material (Preparation Example 1, solid line) and the case where an organic light emitting material was doped and used by using the delayed fluorescent material as a host (Preparation Example 3, alternated long and short dash line).

In Preparation Example 1, after a TADF delayed fluorescent material was dissolved in an N-methyl-2-pyrrolidone solvent, PL intensity according to a wavelength was measured, and the results were illustrated by a solid line of FIG. 12.

In Preparation Example 3, after a TADF host material and a red flourescence dopant material were dissolved in an N-methyl-2-pyrrolidone solvent, PL intensity according to a wavelength was measured, and the results were illustrated by an alternated long and short dash line of FIG. 12.

Referring to FIG. 12, it can be seen that when an organic light emitting material is doped using a delayed fluorescent material as a host, the energy of the delayed fluorescent layer is effectively transferred to the organic light emitting material, thereby adjusting the light intensity and the light emission wavelength.

According to the exemplary embodiment of the present disclosure, a temperature sensor with improved sensitivity can be provided by measuring the temperature using a change in the intensity of light using delayed fluorescence.

In addition, according to the exemplary embodiment of the present disclosure, the organic light emitting layer is formed by doping a delayed fluorescent material to the host or doping an organic light emitting material using the delayed fluorescent material as a host, thereby providing a temperature sensor with more improved sensitivity than a single layer of the delayed fluorescent material.

Further, according to the exemplary embodiment of the present disclosure, such a temperature sensor may manufacture a temperature sensor with high sensitivity at a simple process and low cost.

Further, according to the exemplary embodiment of the present disclosure, a transparent type temperature sensor may be provided by using a transparent temperature transfer unit and a transparent electrode.

Further, according to the exemplary embodiment of the present disclosure, a sensor unit material is used as an organic material, thereby implementing a flexible device.

Figure 13:
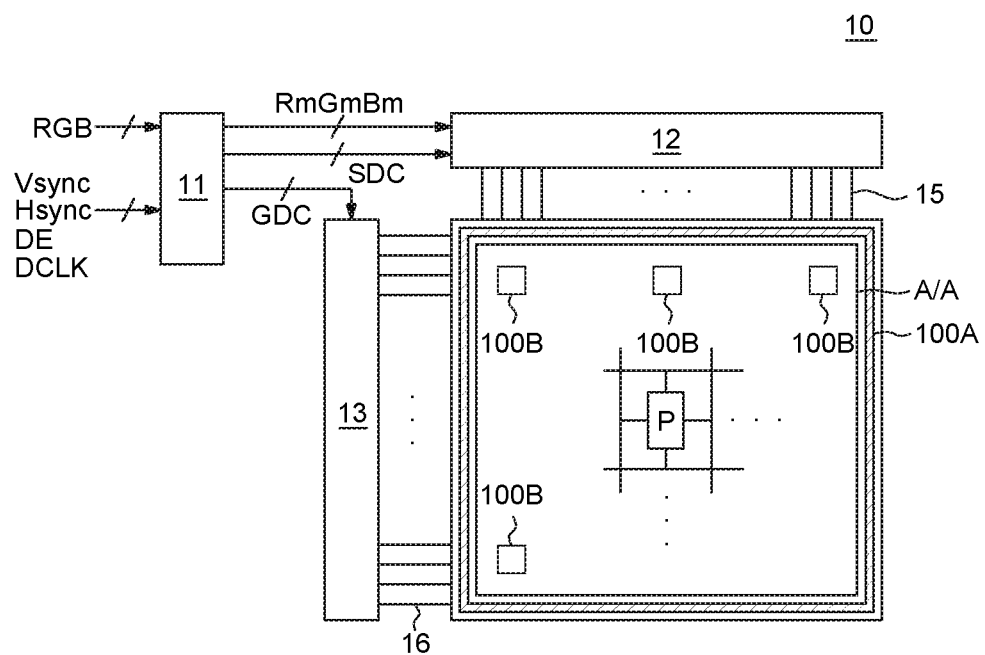
FIG. 13 is an example of a display device to which the temperature sensor of the present disclosure is applied according to an embodiment of the present disclosure.

FIG. 13 is an example of a display device to which the temperature sensor of the present disclosure is applied.

The temperature sensor according to the exemplary embodiment of the present disclosure may be applied to various technical fields requiring temperature detection. Particularly, the temperature sensor may be applied to an organic light emitting display using an organic light emitting diode, an organic light emitting illumination device, and the like.

An organic light emitting display (OLED) 10 displays an image using a plurality of pixels in a matrix form. Each pixel may include a light emitting element (for example, an organic light emitting diode) and a driving circuit (a driving TFT, a switching TFT, a capacitor, and the like) operating the light emitting element. The driving circuit controls an amount of current flowing through the light emitting element to adjust the brightness of each pixel. Further, the OLED includes a data driver 12 supplying a data signal to each pixel through a data line 15; a gate driver 13 supplying a scan signal to each pixel through a gate line 16; a timing controller 11 controlling operations of data/gate drivers 12 and 13, and the like. The timing controller 11 generates a source control signal SDC for controlling an operation timing of the data driver 12 and a gate control signal GDC for controlling an operation timing of the gate driver 13 based on timing signals such as a vertical synchronization signal Vsync, a horizontal synchronization signal Hsync, a dot clock signal DCLK, and a data enable signal DE input from a system board.

The OLED 10 includes an active area A/A in which an image is displayed and an inactive area I/A in which the image is not displayed. In the active area, a pixel array is located. Each of the pixels P may include an organic light emitting diode and a driving circuit operating the organic light emitting diode. For example, each of the pixels may include an organic light emitting diode, a driving TFT controlling the amount of current flowing in the organic light emitting diode, a switching TFT, a storage capacitor, and the like. Each pixel driving circuit may be electrically connected to a gate line and a data line to communicate with a gate driver, a data driver, and the like located in the inactive area.

The inactive area may be disposed around the active area. That is, the inactive area may be adjacent to one or more sides of the active area. The active area and the inactive area may be in a form suitable for a design of an electronic device on which the OLED 10 is mounted, for example, a pentagon, a hexagon, a circle, an ellipse or the like. The gate driver 13 and the data driver 12 may be implemented as a thin film transistor TFT in the inactive area. Such a driver may be referred to as a gate-in-panel (GIP). In addition, some components, such as a data driver IC, may be mounted on a separate printed circuit board, and may be coupled with a connection interface (a pad, a bump, a pin, and the like) disposed in the inactive area through a circuit film such as a flexible printed circuit board (FPCB), a chip-on-film (COF), a tape-carrier-package (TCP), and the like. The printed circuit board (COF, PCB, or the like) may be located behind the OLED.

Since the OLED uses a self-light emitting element, heat is generated during driving and the temperature rises. As a result, the characteristics, degradation degree, and the like of the components (transistors, capacitors, and the like) of the organic light emitting diode and/or the driving circuit are changed. Therefore, in order for the OLED to maintain proper image quality, it is necessary to compensate for such changes. Further, for optimal compensation, accurate temperature sensing is required.

Since temperature sensors 100A and 100B according to the exemplary embodiment of the present disclosure are similar to the organic light emitting diode in configuration to be easily applied to the temperature detection of the OLED 10. The temperature sensor may be disposed on all or a part of the inactive area as illustrated in 100A in FIG. 13, to detect the ambient temperature. Alternatively, the temperature sensor may be disposed in the active area as illustrated in 100B in FIG. 13 to detect the temperature and function as a part of the display pixel. That is, the OLED 10 according to the exemplary embodiment of the present disclosure may include pixels having an organic light emitting diode and a driving circuit operating the organic light emitting diode; and the temperature sensors described in FIGS. 1 to 12. In this case, the temperature sensors 100A and 100B are located in at least one of the active area A/A where the pixels are disposed and the inactive area I/A around the active area. The temperature sensors 100A and 100B may be located at one point or a plurality of points of the OLED 10. That is, the temperature sensors 100A and 100B may measure temperatures at one point or a plurality of points of the OLED 10.

When the temperature sensor is located in the active area, the temperature sensor 100B may operate as a display element displaying an image and a temperature detection element detecting an ambient temperature. That is, the temperature sensor 100B may perform a double function as a display pixel and a temperature sensor.

Figure 14:
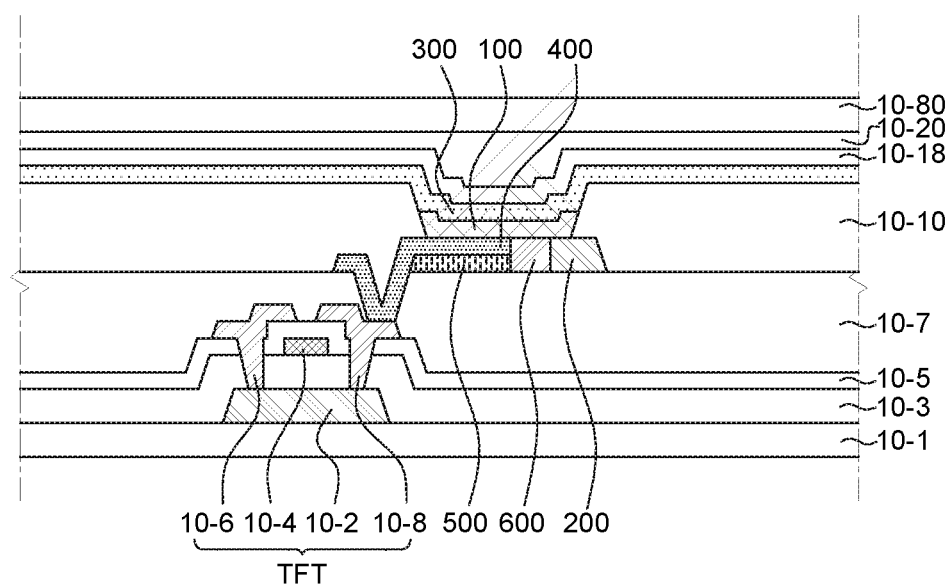
FIG. 14 is a cross-sectional view of a temperature sensor disposed in a display area of an organic light emitting display according to an embodiment of the present disclosure.

FIG. 14 is a cross-sectional view of a temperature sensor disposed in an active area of an organic light emitting display.

Referring to FIG. 14, a thin film transistor TFT, an organic light emitting diode, and various functional layers are located on a first substrate 10-1 and the thin film transistor TFT and the organic light emitting diode are connected to each other. In this case, an electrode of the organic light emitting diode may be an electrode of the temperature sensor 100B. That is, the first electrode 300 or the second electrode 400 of the temperature sensor 100B may be connected to a driving transistor included in the driving circuit.

The first substrate (alternatively, an array substrate) 10-1 may be a glass or plastic substrate. In the case of the plastic substrate, polyimide-based or polycarbonate-based materials may be used to have flexibility.

The thin film transistor TFT may include a semiconductor layer 10-2, a gate insulating layer 10-3, a gate electrode 10-4, an interlayer insulating layer 10-5, and source and drain electrodes 10-6 and 10-8, which are sequentially disposed on the first substrate 10-1. The semiconductor layer 10-2 may be made of polysilicon (p-Si), and in this case, a predetermined area may be doped with an impurity. Further, the semiconductor layer 10-2 may be made of amorphous silicon (a-Si), or may be made of various organic semiconductor materials such as pentacene. Furthermore, the semiconductor layer 10-2 may be made of oxide. The gate insulating layer 10-3 may be made of an insulating inorganic material such as silicon oxide (SiOx) or silicon nitride (SiNx), or may also be made of an insulating organic material or the like. The gate electrode 10-4 may be made of various conductive materials, for example, magnesium (Mg), aluminum (Al), nickel (Ni), chromium (Cr), molybdenum (Mo), tungsten (W), gold (Au), alloys thereof, or the like. The interlayer insulating layer 10-5 may be made of an insulating material such as silicon oxide (SiOx) or silicon nitride (SiNx), or may also be made of an insulating organic material or the like. Contact holes where the source and drain regions are exposed may be formed by selectively removing the interlayer insulating layer 10-5 and the gate insulating layer 10-3. The source and drain electrodes 10-6 and 10-8 are formed on the interlayer insulating layer 10-5 with materials for the gate electrode 10-4 in a shape of a single layer or a multilayer.

A planarization layer 10-7 may be located on the thin film transistor TFT. The planarization layer 10-7 protects and planarizes the thin film transistor TFT. The planarization layer 10-7 may be formed in various shapes and may be variously modified such as being formed of an organic insulating layer such as benzocyclobutene (BCB) or acryl, or an inorganic insulating layer such as a silicon nitride film (SiNx) or a silicon oxide film (SiOx) And may be formed as a single layer, or may be configured by a double layer or a plurality of layers.

The organic light emitting diode may have a form in which the second electrode 400, the organic light emitting layer 100, and the first electrode 300 are sequentially disposed. That is, the organic light emitting diode may be configured by the second electrode 400 formed on the planarization layer 10-7, the organic light emitting layer 100 located on the second electrode 400, and the first electrode 100 located on the organic light emitting layer 100.

The second electrode 400 is electrically connected to the drain electrode 10-8 of a driving thin film transistor TFT through a contact hole. When the OLED 100 is a top emission type, the second electrode 400 may be made of an opaque conductive material having high reflectance. For example, the second electrode 400 may be made of silver (Ag), aluminum (Al), gold (Au), molybdenum (Mo), tungsten (W), chromium (Cr), alloys thereof, or the like.

A bank 10-10 is formed in other areas except for a light emission area. Accordingly, the bank 10-10 has a bank hole exposing the second electrode 400 corresponding to the light emission area. The bank 10-10 may be made of an inorganic insulating material such as a silicon nitride film (SiNx) and a silicon oxide film (SiOx), or an organic insulating material such as BCB, an acrylic-based resin or an imide-based resin.

The organic light emitting layer 100 is located on the second electrode 400 exposed by the bank 10-10. The organic light emitting layer 100 may include a light emitting layer, an electron injection layer, an electron transport layer, a hole transport layer, a hole injection layer, and the like. When a delayed fluorescent material is included in the organic light emitting layer 100 as a host or a dopant, the light emission efficiency may be increased.

The first electrode 300 is located on the organic light emitting layer 100. When the OLED 100 is a top emission type, the first electrode 300 is made of a transparent conductive layer such as indium tin oxide (ITO) or indium zinc oxide (IZO) to emit the light generated in the organic light emitting layer 100 to the top of the first electrode 300. When the OLED 100 is a bottom emission type, the second electrode 400 is made of a transparent conductive material to emit the light generated in the organic light emitting layer 100 to the bottom of the second electrode 400.

When the temperature transfer unit 200, the light intensity measuring unit 500 and the temperature intercept unit 600 are added to the configuration of the organic light emitting diode, the organic light emitting diode may operate as the temperature sensors illustrated in FIGS. 1 to 12. The locations of the temperature transfer unit 200, the light intensity measuring unit 500 and the temperature intercept unit 600 may be changed according to the top/bottom emission type.

A passivation layer 10-18 is located on the first electrode 300. In this case, the passivation layer may be formed of an inorganic film made of glass, metal, aluminum oxide (AlOx) or a silicon (Si)-based material, or may have a structure in which an organic film and an inorganic film may be alternately laminated. The passivation layer 10-18 prevents oxygen and moisture from penetrating from the outside to prevent oxidation of a light emitting material and an electrode material. When the organic light emitting diode is exposed to moisture or oxygen, a pixel shrinkage phenomenon in which the light emission area is reduced may occur or a dark spot in the light emission area may occur.

A second substrate 10-80 faces a first substrate 10-1. The second substrate 10-80 may be an encapsulation plate. The lower surface of the second substrate 10-80 may be in contact with a filler 10-20. The second substrate 10-80 may be made of a material such as glass, polymer, or metal, and a constituent material of the second substrate 10-80 may be determined according to a light emission direction of the OLED 10. The second substrate 10-80 may perform an encapsulation function blocking moisture. On the other hand, in the case of a white organic light emitting type, color filters and a black matrix for partitioning the color filters may be disposed on the second substrate 10-80.

The filler 10-20 is located on the top of the passivation layer 10-18 and fills a space between the passivation layer 10-18 and the second substrate 10-80. The filler 10-20 may be made of a material that may be cured by ultraviolet light and/or heat. As a material of the filler 10-20, any one of acrylic-based, epoxy-based, silicone-based and rubber-based resins or a mixture thereof may be used.

As such, when the temperature sensor 100B is located in the active area A/A, the temperature sensor 100B may operate as a display element displaying an image and a temperature detection element detecting an ambient temperature. That is, the temperature sensor 100B may perform a double/dual function as a display pixel and a temperature sensor.

The OLED 10 according to the exemplary embodiment of the present disclosure may further include a controller performing various compensations based on the temperature of the display device and/or the display element detected by the temperature sensors 100A and 100B. The controller may perform a function of compensating for a change in characteristics of the organic light emitting diode or the driving circuit, adjusting luminance of an image displayed by the pixel, or compensating for a deterioration value according to a temperature of the organic light emitting diode or the driving circuit. In the case, the controller may be a timing controller 11 and also be a separate controller.

The temperature sensors 100A and 100B may be connected to the controller to provide temperature information for various compensations to the controller. When the temperature sensors 100A and 100B are disposed at a plurality of points in the active area or the inactive area, the controller may compensate for changes in characteristics and luminance of the organic light emitting diode or the driving circuit individually for each zone set corresponding to the temperature sensors 100A and 100B.

Figure 15A:
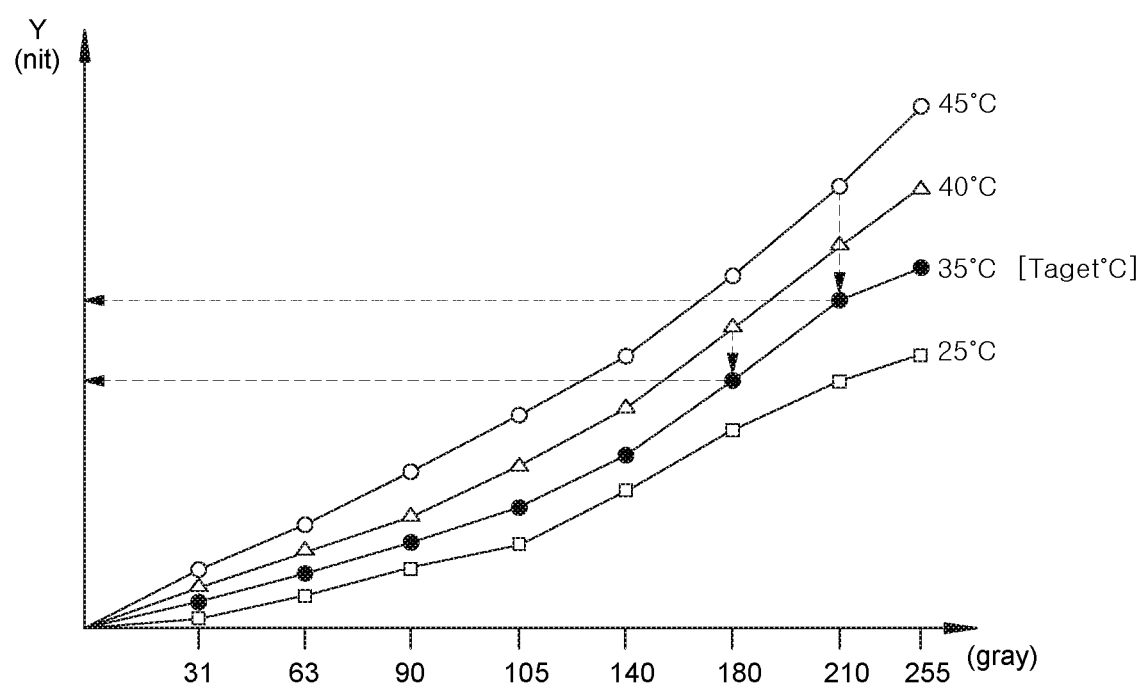
FIGS. 15A and 15B are diagrams for describing luminance compensation performed by a controller in an organic light emitting display according to an exemplary embodiment of the present disclosure.
Figure 15B:
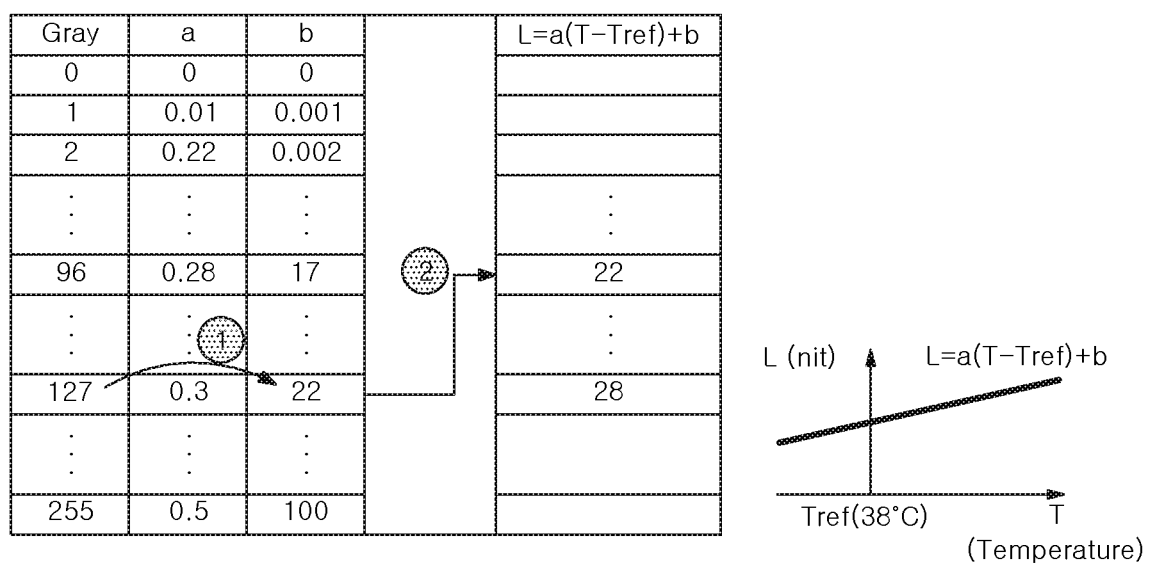

FIGS. 15A and 15B are diagrams for describing luminance compensation performed by a controller in an organic light emitting display according to an exemplary embodiment of the present disclosure.

The controller according to the exemplary embodiment may generate compensation data for maintaining or updating grayscale values of input image data RGB based on the temperature and/or the degree of deterioration of the OLED 10. At this time, the controller may use a predetermined compensation value according to a luminance comparison result of the input image data RGB and reference data depending on a particular target temperature.

For example, the controller may maintain or update the grayscale values of the input image data RGB with a particular compensation value according to the comparison result of the input image data RGB with the reference data according to a particular target temperature (for example, 35° C.) to generate compensation data. To this end, the controller acquires information on temperatures (for example, 25° C., 35° C., 40° C., and 45° C. illustrated in FIG. 15A) at one point or a plurality of points of the display device by the temperature sensors 100A and 100B. If it is determined that the temperatures at one point or a plurality of points of the OLED 10 are 40° C., 45° C., and 25° C. which are higher or lower than the target temperature (for example, 35° C.), the controller generates compensation data compensating so that the grayscale level and luminance of the input image data RGB is close to the grayscale level and luminance of the reference data according to the target temperature (for example, 35° C.).

To this end, if the temperatures at one point or a plurality of points of the OLED 10 are higher or lower than the target temperature, as illustrated in FIG. 15B, the controller may calculate a luminance L (L=(T−Tref)+b) value corresponding to a difference b between the grayscale level and luminance of the input image data RGB and the grayscale level and luminance of the reference data according to the target temperature using at least one look-up table LUT and maintain or update the grayscale values of the input image data RGB with a compensation value corresponding to the calculated luminance value.

Herein, a of the look-up table LUT illustrated in FIG. 15B as a luminance change value according to a temperature change at any grayscale corresponds to a slope of the graph illustrated in FIG. 15B. In addition, b may be a target luminance of the input image data RGB as a luminance value at a target temperature Tref for each grayscale. In particular, the values a and b are predetermined and/or stored data values, and the controller sequentially disposes the compensation data in accordance with the size and resolution of the display device, and sequentially supplies the compensated data to the data driver by a unit of at least one horizontal line to display the compensation data as an image.

As another example, the controller may change a gamma reference voltage according to the temperature of the OLED 10 to uniformly maintain the luminance of the OLED 10. At this time, the temperature sensors 100A and 100B sense the temperatures at one point or a plurality of points, and supply the sensed temperature information to the controller. The controller may compare the received temperature information with a reference temperature to supply a gamma signal for changing the gamma reference voltage. The operation of the controller will be described as follows by exemplifying the following Table 2.

TABLE 2

| Detection temperature (° C.) (DTS) | Reference temperature (° C.) | Difference value (input temperature − reference temperature) | Temperature compensation voltage |
|---|---|---|---|
| 30° C. | 35° C. | −5° C. | 0 |
| 35° C. | 35° C. | 0° C. | 0 |
| 38° C. | 35° C. | 3° C. | 3 mV |
| 40° C. | 35° C. | 5° C. | 5 mV |
| 42° C. | 35° C. | 7° C. | 7 mV |
| 44° C. | 35° C. | 9° C. | 9 mV |
| 46° C. | 35° C. | 11° C. | 11 mV |
| 48° C. | 35° C. | 13° C. | 13 mV |
| 50° C. | 35° C. | 15° C. | 15 mV |

Assuming that the reference temperature is set to 35° C., the controller does not send a gamma signal because the detection temperature of 30° C. is lower than the reference temperature. In addition, even when the detection temperature is 35° C., the controller does not send the gamma signal because the detection temperature is the same as the reference temperature. On the other hand, if the detection temperature of 38° C. exceeds the reference temperature, it is recognized that it is necessary to compensate for the temperature, and the controller supplies a gamma signal which reduces the gamma reference voltage 3 mV level corresponding to the difference temperature 3° C. exceeding the reference temperature. As such, the controller changes the gamma reference voltage when the detection temperature is different from the reference temperature to improve uniformity of the image quality.

The controller may compensate for a change in characteristics of the organic light emitting diode or the driving circuit in association with the temperature sensors 100A and 100B of the present disclosure. The characteristics of the organic light emitting diode or the driving circuit may be a threshold voltage of the organic light emitting diode, mobility of the transistor, a threshold voltage of the transistor, and the like.

First, a case where the controller compensates for the threshold voltage of the organic light emitting diode in association with the temperature sensors 100A and 100B will be described. The threshold voltage of the organic light emitting diode is influenced by the temperature of the OLED 10. Accordingly, when the temperature sensors disposed at one point or a plurality of points of the OLED 10 detects the ambient temperatures and provide temperature information to the controller, the controller determines a compensation voltage based on the temperature information.

Further, even if the organic light emitting diode deteriorates to the same degree, the threshold voltage to be sensed may vary depending on the temperature. In addition, even if the threshold voltage to be sensed is the same, it is difficult to judge that the organic light emitting diode deteriorates to the same extent unless the temperature of the OLED 10 is considered. Accordingly, if the temperature information is acquired by the temperature sensor, the controller may minimize an error and generate the compensation value according to the deterioration.

Figure 16A:
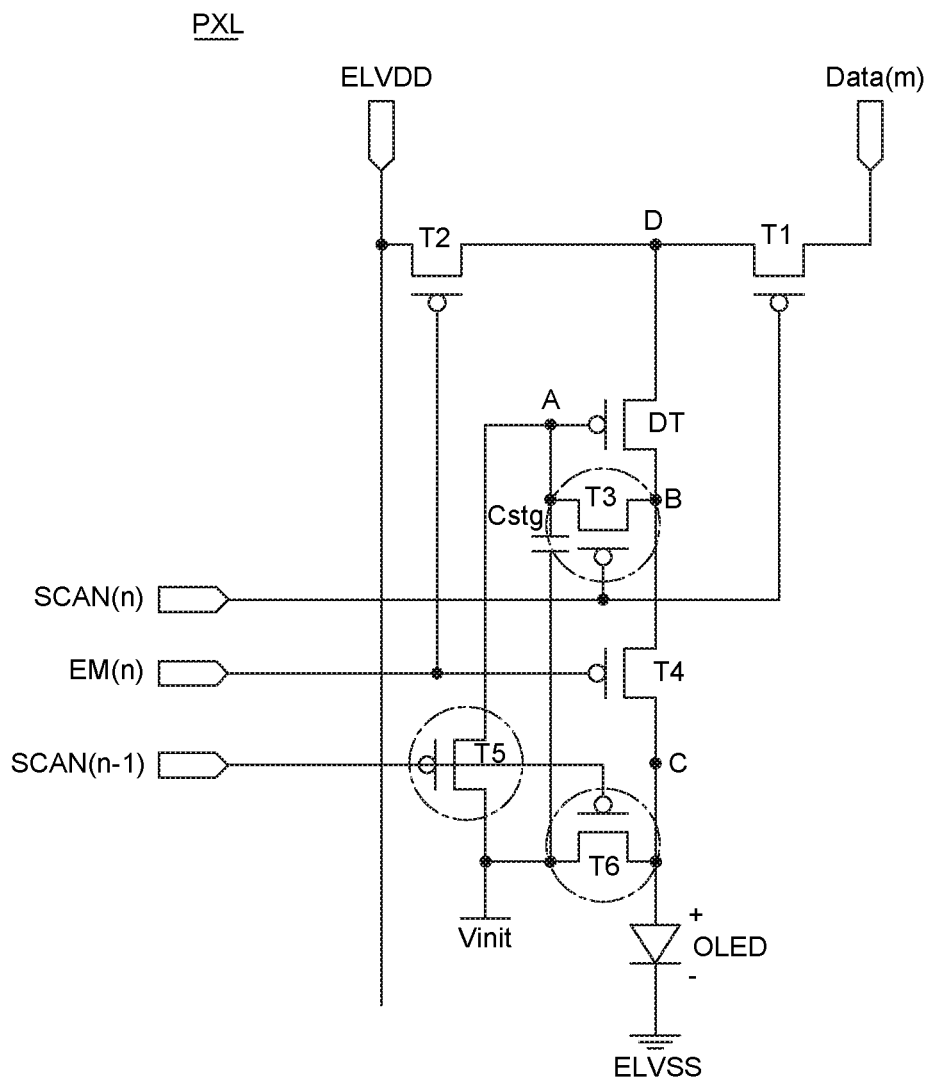
FIGS. 16A and 16B are diagrams illustrating a driving circuit provided in a pixel and an example of an operation thereof according to an embodiment of the present disclosure.
Figure 16B:
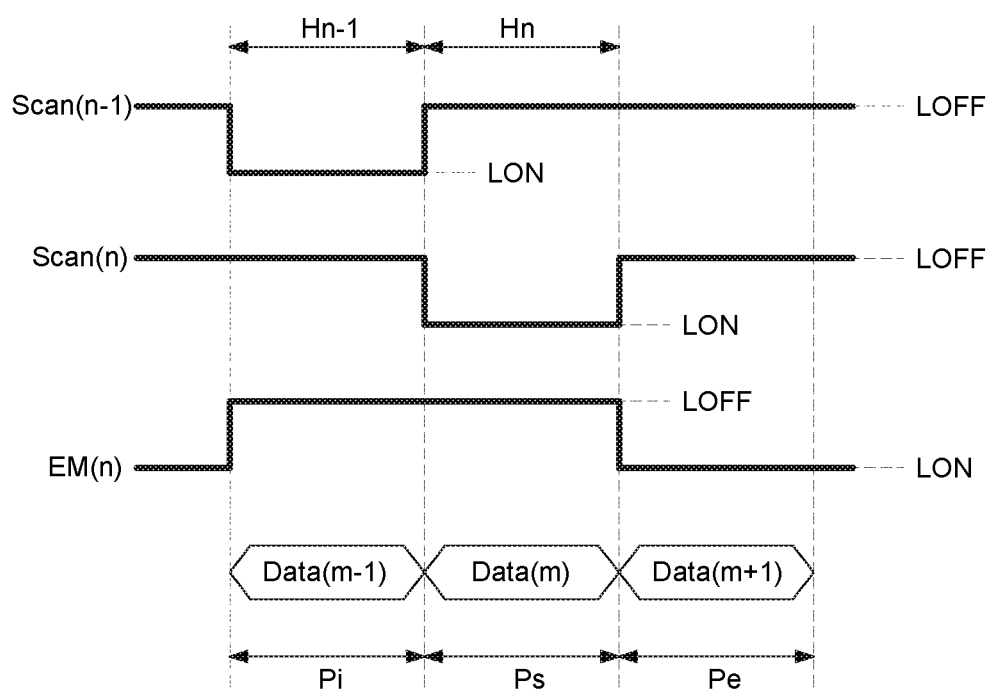

FIGS. 16A and 16B are diagrams illustrating a driving circuit provided in a pixel and an example of an operation thereof. Referring to FIGS. 16A and 16B, a case where the controller compensates for the characteristics of the driving circuit in association with the temperature sensor will be described.

Referring to FIG. 16A, each pixel disposed in the n-th (n is a natural number) row includes an organic light emitting diode OLED, a driving TFT DT, a first TFT T1, a second TFT T2, a third TFT T3, a fourth TFT T4, a fifth TFT T5, and a storage capacitor Cst.

The organic light emitting diode OLED emits light by a driving current supplied from the driving TFT DT. A multi-layered organic compound layer is formed between an anode and a cathode of the organic light emitting diode OLED. The anode electrode of the organic light emitting diode OLED is connected to a node C, and the cathode electrode of the organic light emitting diode OLED is connected to an input terminal of a low potential driving voltage ELVSS. The organic light emitting diode OLED may be configured as illustrated in FIGS. 13 to 14 to function as a temperature sensor. In this case, the anode of the organic light emitting diode OLED may be the second electrode 400 of FIG. 14, and the cathode may be the first electrode 300 of FIG. 14.

The driving TFT DT controls a driving current applied to the organic light emitting diode OLED according to a source-gate voltage Vsg of the driving TFT DT. A gate electrode of the driving TFT DT is connected to a node A, a source electrode of the driving TFT DT is connected to a node D, and a drain electrode of the driving TFT DT is connected to a node B.

The first TFT T1 is connected between the data line 14 and the node D and turned on/off according to an n-th scan signal SCAN(n). A gate electrode of the first TFT T1 is connected to the n-th first scan line to which the n-th scan signal SCAN(n) is applied, a source electrode of the first TFT T1 is connected to the data line 14, and a drain electrode of the first TFT T1 is connected to the node D.

The second TFT T2 is connected between the node D and an input terminal of a high potential driving voltage ELVDD and turned on/off according to an n-th emission signal EM(n). A gate electrode of the second TFT T2 is connected to an n-th first emission line to which the n-th emission signal EM(n) is applied, a source electrode of the second TFT T2 is connected to the input terminal of the high potential driving voltage ELVDD, and a drain electrode of the second TFT T2 is connected to the node D.

The third TFT T3 is connected between the node A and the node B and turned on/off according to the n-th scan signal SCAN(n). A gate electrode of the third TFT T3 is connected to the n-th first scan line to which the n-th scan signal SCAN(n) is applied, a source electrode of the third TFT T3 is connected to the node A, and a drain electrode of the third TFT T3 is connected to the node B.

The fourth TFT T4 is connected between the node B and the node C and turned on/off according to the n-th emission signal EM(n). A gate electrode of the fourth TFT T4 is connected to the n-th first emission line to which the n-th emission signal EM(n) is applied, a source electrode of the fourth TFT T4 is connected to the node B, and a drain electrode of the fourth TFT T4 is connected to the node C.

The fifth TFT T5 is connected between the node A and an input terminal of an initialization voltage Vinit and turned on/off according to an n−1-th scan signal SCAN(n−1). A gate electrode of the fifth TFT T5 is connected to the n−1-th first scan line to which the n−1-th scan signal SCAN(n−1) is applied, a source electrode of the fifth TFT T5 is connected to the node A, and a drain electrode of the fifth TFT T5 is connected to the input terminal of the initialization voltage Vinit.

The storage capacitor Cst is connected between the node A and the input terminal of the initialization voltage Vinit.

The sixth TFT T6 is connected between the input terminal of the initialization voltage Vinit and the node C. A gate electrode of the sixth TFT T6 is connected to the n−1-th first scan line to which the n−1-th scan signal SCAN(n−1) is applied, a source electrode of the sixth TFT T6 is connected to the node C, and a drain electrode of the sixth TFT T6 is connected to the input terminal of the initialization voltage Vinit. The pixel driving circuit of FIG. 16A further includes the sixth TFT T6 to fix the node C potential, thereby improving the sampling accuracy. Accordingly, operation stability of the circuit is improved.

One frame period may be divided into an initial period Pi for initializing the node A and the node C, a sampling period Ps for sampling the threshold voltage of the driving TFT DT and storing the sampled threshold voltage in the node A, and an emission period Pe for programming the source-gate voltage of the TFT DT including the sampled threshold voltage and emitting the organic light emitting diode OLED with a driving current according to the programmed source-gate voltage. The driving circuit in FIG. 16A performs the initialization operation in an n−1-th horizontal period Hn-1 to allocate all of the n-th horizontal period Hn for the sampling operation. When the sampling period Ps is sufficiently secured as described above, the threshold voltage of the driving TFT DT can be more accurately sampled.

In the initial period Pi, the n−1-th scan signal SCAN(n−1) is applied at an on level and the n-th scan signal SCAN(n) and the n-th emission signal EM(n) are applied at an off level. In the initial period Pi, the fifth and sixth TFTs T5 and T6 are turned on in response to the n−1-th scan signal SCAN(n−1) and thus, the node A and the node C are initialized to the initialization voltage Vinit.

In the sampling period Ps, the n-th scan signal SCAN(n) is applied at an on level and the n−1-th scan signal SCAN(n−1) and the n-th emission signal EM(n) are applied at an off level. In the sampling period Ps, the first and third TFTs T1 and T3 are turned on in response to the n-th scan signal SCAN(n), and thus, the driving TFT DT is diode-connected (the gate electrode and the drain electrode are shorted and the TFT operates like the diode), and a data voltage Vdata(n) is applied to the node D.

In the emission period Pe, the n-th emission signal EM(n) is applied at an on level and the n−1-th scan signal SCAN(n−1) and the n-th scan signal SCAN(n) are applied at an off level. In the emission period Pe, the second TFT T2 is turned on in response to the n-th emission signal EM(n) to connect the high potential driving voltage ELVDD to the source electrode of the driving TFT DT. In addition, the fourth TFT T4 is turned on in response to the n-th emission signal EM(n) to make the potentials of the node B and the node C equal to an operation voltage Voled of the organic light emitting diode OLED.

The relation for the driving current Ioled flowing in the organic light emitting diode OLED in the emission period Pe is expressed by the following Equation 1. The organic light emitting diode OLED emits the light by the driving current to implement a desired display grayscale.

$$I_{OLED} = k/2(Vsg-Vth)^2 = k/2((Vs-Vg)-Vth)^2 = k/2((VDD-Vdata+Vth)-Vth)^2 = k/2(VDD-Vdata)^2 \quad \text{[Equation 1]}$$

In Equation 1, k/2 represents a proportional constant determined by electron mobility, a parasitic capacitance, a channel capacitance, and the like of the driving TFT DT.

Since the driving current Ioled equation is k(Vsg−Vth)2, and the threshold voltage Vth component of the driving TFT DT is already included in Vsg programmed for the emission period Pe, like Equation 1, the threshold voltage Vth component of the driving TFT DT is removed in the driving current Ioled relation. As a result, the influence of the change in threshold voltage Vth on the driving current Ioled is removed.

In the OLED, the light emitting element has a characteristic of being deteriorated when exposed to a continuous stress. Such deterioration affects not only luminance but also color change. Particularly, the light emitting element is largely influenced by a temperature stress. However, since the display device of the OLED generates a temperature difference within the light emission area, the degree of deterioration of the light emitting element due to the temperature stress varies depending on the location of the light emitting element to cause a color afterimage phenomenon.

Accordingly, the controller of the OLED according to the present disclosure may detect the temperature of each pixel provided in the display device and compensate for the deterioration value according to the detected temperature. For example, the controller may map a high temperature area in which pixels having a high temperature are concentrated in the display device to compensate for a deterioration value according to a temperature of the light emitting element located in the high temperature area. In this case, the controller obtains temperature data of each pixel located in the high temperature area by the temperature sensor and reads deterioration data of the light emitting element according to the temperature, to generate data compensating for the deterioration of the light emitting element provided in each of the pixels located in the high temperature area. Also, the controller may correct image data input from the outside using deterioration data of the thin film transistor and deterioration compensation data of the organic light emitting diode, and output the corrected image data to the data line.

The threshold voltage of the driving transistor of the OLED is affected by the ambient temperature change. Accordingly, the controller according to yet another exemplary embodiment of the present disclosure may generate a stabilization control signal having a pulse width changed to correspond to the detected temperature and send the stabilization control signal to change a threshold voltage stabilization period of the driving transistor. To this end, the controller analyzes the temperature of the OLED by the temperature sensors 100A and 100B, determines whether the display device is in room temperature/low temperature/high temperature states, and generates the stabilization control signal to have a pulse width corresponding to each of the room temperature/low temperature/high temperature states.

Although the exemplary embodiments of the present disclosure have been described in detail with reference to the accompanying drawings, the present disclosure is not limited thereto and may be embodied in many different forms without departing from the technical concept of the present disclosure. Therefore, the embodiments disclosed in the present disclosure are used to not limit but describe the technical spirit of the present disclosure and the scope of the technical features of the present disclosure is not limited by the embodiments. The scope of the present disclosure should be interpreted by the appended claims and it should be analyzed that all technical spirit in the equivalent range thereto is intended to be embraced by the scope of the present disclosure.

The invention claimed is:

1. A temperature sensor, comprising:
   a sensor including an organic light emitting layer having a delayed fluorescent material;
   a temperature transfer member located below the sensor to transfer a temperature to the sensor;
   a first electrode located on the sensor;
   a second electrode located below the sensor and spaced apart from the temperature transfer member;
   a photodetector located below the second electrode to measure intensity of light emitted from the organic light emitting layer; and
   a temperature blocker located between the temperature transfer member and the second electrode to intercept a temperature transfer to the second electrode from the temperature transfer member,
   wherein the temperature blocker is located between the photodetector and the temperature transfer member, and the organic light emitting layer in the sensor overlaps with upper surfaces of the photodetector, the temperature blocker and the temperature transfer member.

2. The temperature sensor of claim 1, wherein the intensity of light emitted from the organic light emitting layer is changed according to a temperature.

3. The temperature sensor of claim 1, wherein the organic light emitting layer includes a host material and a dopant material, and the delayed fluorescent material is the dopant material.

4. The temperature sensor of claim 3, wherein the host material of the organic light emitting layer is an organic light emitting material other than the delayed fluorescent material.

5. The temperature sensor of claim 1, wherein the organic light emitting layer includes a host material and a dopant material, and the delayed fluorescent material is the host material.

6. The temperature sensor of claim 5, wherein the dopant material of the organic light emitting layer is an organic light emitting material other than the delayed fluorescent material.

7. The temperature sensor of claim 1, wherein the photodetector determines a temperature according to a change in the intensity of light emitted from the light emitting layer.

8. The temperature sensor of claim 1, wherein the first electrode and the second electrode have a multilayered structure having $CuAlO_2/Ag/CuAlO_2$, ITO/Ag/ITO, ZnO/Ag/ZnO, ZnS/Ag/ZnS, $TiO_2/Ag/TiO_2$, ITO/Au/ITO, $WO_3/Ag/WO_3$, or $MoO_3/Ag/MoO_3$.

9. An organic light emitting display, comprising:
   a plurality of pixels including organic light emitting diodes and driving circuits for operating the organic light emitting diodes; and
   the temperature sensor of claim 1, located in at least one of an active area in which the pixels are disposed and an inactive area around the active area.

10. The organic light emitting display of claim 9, wherein the temperature sensor is located in the active area, and the temperature sensor operates an element for displaying an image and an element for detecting an ambient temperature.

11. The organic light emitting display of claim 10, wherein the first electrode or the second electrode of the temperature sensor is connected with a driving transistor included in the corresponding driving circuit.

12. The organic light emitting display of claim 11, further comprising:
    a controller configured to compensate for changes in characteristics of the organic light emitting diode or the driving circuit based on the temperature detected by the temperature sensor.

13. The organic light emitting display of claim 12, wherein a plurality of the temperature sensors are located at a plurality of points in the active area, and the controller compensates for changes in characteristics of the organic light emitting diode or the driving circuit individually for each zone set corresponding to the temperature sensors.

14. The organic light emitting display of claim 12, wherein the characteristics of the organic light emitting diode or the driving circuit include at least one of a threshold voltage of the organic light emitting diode, mobility of the transistor, and a threshold voltage of the transistor.

15. The organic light emitting display of claim 9, further comprising:
    a controller configured to adjust a luminance of the image displayed by at least one of the pixels based on a temperature detected by the temperature sensor.

16. The organic light emitting display of claim 9, further comprising:
    a controller configured to compensate for a deterioration value according to a temperature of one of the organic light emitting diodes or driving circuits based on a temperature detected by the temperature sensor.

17. A method for manufacturing a temperature sensor, the method comprising:
    forming a sensor including an organic light emitting layer having a delayed fluorescent material on a first electrode;
    forming a temperature transfer member for transferring an external temperature to the sensor in a partial area on the sensor;
    forming a temperature blocker on the sensor to be adjacent to a side of the temperature transfer member;
    forming a second electrode on the sensor to be adjacent to a side of the temperature blocker, the second electrode being spaced apart from the temperature transfer member; and
    forming a photodetector on the second electrode to measure intensity of light emitted from the organic light emitting layer,
    wherein the temperature blocker intercepts a temperature transfer to the second electrode from the temperature transfer member, and
    wherein the temperature blocker is located between the photodetector and the temperature transfer member, and the organic light emitting layer in the sensor overlaps with upper surfaces of the photodetector, the temperature blocker and the temperature transfer member.

18. The method of claim 17, wherein the intensity of light emitted from the organic light emitting layer is changed according to a temperature.

19. The method of claim 17, wherein the delayed fluorescent material includes at least one selected from the group consisting of $SnF_2$-Copro III, $SnF_2$-Meso IX, $SnF_2$-Hemato IX, $SnF_2$-Proto IX, $SnF_2$-OEP, $SnF_2$-Etiol, 2CzPN, 4CzIPN, 4CzPN, 4CzTPN, 4CzTPN-Me, 4CzTPN-Ph, PXZ-OXD, 2PXZ-OXD, PXZ-TAZ and 2PXZ-TAZ.

* * * * *